(12) United States Patent
Yoneda et al.

(10) Patent No.: US 12,074,179 B2
(45) Date of Patent: Aug. 27, 2024

(54) IMAGING DEVICE AND ELECTRONIC DEVICE

(71) Applicant: SEMICONDUCTOR ENERGY LABORATORY CO., LTD., Atsugi (JP)

(72) Inventors: Seiichi Yoneda, Kanagawa (JP); Toshiki Hamada, Kanagawa (JP); Yuki Okamoto, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 102 days.

(21) Appl. No.: 17/781,152

(22) PCT Filed: Dec. 14, 2020

(86) PCT No.: PCT/IB2020/061871
§ 371 (c)(1),
(2) Date: May 31, 2022

(87) PCT Pub. No.: WO2021/130590
PCT Pub. Date: Jul. 1, 2021

(65) Prior Publication Data
US 2022/0415941 A1    Dec. 29, 2022

(30) Foreign Application Priority Data

Dec. 27, 2019  (JP) .................................. 2019-238757

(51) Int. Cl.
*H01L 27/146*    (2006.01)
*H04N 25/75*     (2023.01)
*H04N 25/77*     (2023.01)

(52) U.S. Cl.
CPC .. *H01L 27/14612* (2013.01); *H01L 27/14636* (2013.01); *H04N 25/75* (2023.01); *H04N 25/77* (2023.01)

(58) Field of Classification Search
CPC ............. H01L 27/146; H01L 27/14612; H01L 27/14636; H04N 25/46; H04N 25/75; H04N 25/77; H04N 25/772
See application file for complete search history.

(56) References Cited

U.S. PATENT DOCUMENTS 8,378,391 B2   2/2013   Koyama et al.
9,716,852 B2   7/2017   Kurokawa
(Continued)

FOREIGN PATENT DOCUMENTS

CN   110651468 A   1/2020
CN   110870299 A   3/2020
(Continued)

OTHER PUBLICATIONS

International Search Report (Application No. PCT/IB2020/061871) Dated Mar. 30, 2021.
(Continued)

*Primary Examiner* — Amy R Hsu
(74) *Attorney, Agent, or Firm* — NIXON PEABODY LLP; Jeffrey L. Costellia

(57) ABSTRACT

An imaging device with an arithmetic function in which the circuit size is reduced is provided. The imaging device includes a plurality of pixel blocks. Each of the pixel blocks includes N (N is an integer greater than or equal to 1) first circuits, N second circuits, and a third circuit. Each of the first circuits includes a photoelectric conversion device, and the photoelectric conversion device has a function of converting incident light into an electrical signal and has a function of outputting a first signal that is obtained by (Continued)

binarizing the electrical signal to the second circuit. Each of the second circuits has a function of outputting a second signal that is obtained by multiplying the first signal by a weight coefficient to a third circuit. When the N second signals are output to a wiring electrically connected to the third circuit, addition is performed. The first circuit includes a transistor, and an OS transistor is preferably used as the transistor.

12 Claims, 17 Drawing Sheets

(56) References Cited

U.S. PATENT DOCUMENTS

| | | | |
|---|---|---|---|
| 9,773,787 B2 | 9/2017 | Matsuzaki | |
| 9,773,832 B2 | 9/2017 | Kurokawa | |
| 9,851,942 B2 | 12/2017 | Kurokawa | |
| 9,934,826 B2 | 4/2018 | Kurokawa | |
| 10,109,633 B2 | 10/2018 | Kurokawa | |
| 10,664,748 B2 | 5/2020 | Kurokawa | |
| 10,699,628 B2 | 6/2020 | Yamazaki et al. | |
| 11,099,814 B2 | 8/2021 | Harada et al. | |
| 11,101,302 B2 | 8/2021 | Ikeda et al. | |
| 11,195,866 B2 | 12/2021 | Ikeda | |
| 11,275,993 B2 * | 3/2022 | Ishizu | G06T 1/20 |
| 11,302,726 B2 | 4/2022 | Kobayashi et al. | |
| 11,335,813 B2 | 5/2022 | Kobayashi et al. | |
| 2020/0091214 A1 | 3/2020 | Ikeda | |
| 2020/0160158 A1 | 5/2020 | Okamoto et al. | |
| 2020/0176493 A1 | 6/2020 | Ikeda et al. | |
| 2020/0273895 A1 * | 8/2020 | Sasago | H01L 27/14627 |
| 2021/0151486 A1 * | 5/2021 | Kobayashi | H04N 23/00 |
| 2021/0384239 A1 | 12/2021 | Ikeda et al. | |
| 2022/0093661 A1 | 3/2022 | Ikeda | |
| 2022/0321794 A1 * | 10/2022 | Yoneda | H01L 27/146 |

FOREIGN PATENT DOCUMENTS

| | | |
|---|---|---|
| JP | 2011-119711 A | 6/2011 |
| JP | 2016-123087 A | 7/2016 |
| KR | 2020-0012917 A | 2/2020 |
| KR | 2020-0024151 A | 3/2020 |
| WO | WO-2018/215882 | 11/2018 |
| WO | WO-2018/224910 | 12/2018 |
| WO | WO-2019/012370 | 1/2019 |

OTHER PUBLICATIONS

Written Opinion (Application No. PCT/IB2020/061871) Dated Mar. 30, 2021.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner

IMAGING DEVICE AND ELECTRONIC DEVICE

TECHNICAL FIELD

The present invention relates to an imaging device. In particular, the present invention relates to an imaging device having an arithmetic function.

Note that one embodiment of the present invention is not limited to the above technical field. The technical field of the invention disclosed in this specification and the like relates to an object, a method, or a manufacturing method. One embodiment of the present invention also relates to a process, a machine, manufacture, or a composition of matter.

Background Art

A neural network has been utilized in the field of image recognition. For image recognition, a convolutional operation for detecting features of image data is performed, in which image data is multiplied by a coefficient called a filter and summation is performed (product-sum operation), and then the filter is shifted and the same operation is repeated. A binary neural network (BNN), in particular, can drastically reduce the circuits that are required for product-sum operation by representing data in binary.

A technique for adding an arithmetic function to an imaging device is disclosed in Patent Document 1.

Meanwhile, a transistor including an oxide semiconductor or a metal oxide in its channel formation region (also referred to as an oxide semiconductor transistor or an OS transistor) has been attracting attention with its extremely small drain current when the transistor is off (also referred to as an off-state current) (see Non-Patent Documents 1 and 2). For example, an imaging device with a structure in which an OS transistor is used in a pixel circuit is disclosed in Patent Document 2.

In addition, a CAAC (c-axis aligned crystalline) structure and an nc (nanocrystalline) structure, which are neither single crystal nor amorphous, have been found in an oxide semiconductor (see Non-Patent Document 1 and Non-Patent Document 3). Non-Patent Document 1 and Non-Patent Document 3 also disclose a technique for fabricating a transistor using an oxide semiconductor having a CAAC structure.

REFERENCE

Patent Document

[Patent Document 1] Japanese Published Patent Application No. 2016-123087

[Patent Document 2] Japanese Published Patent Application No. 2011-119711

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Yamazaki et al., "SID Symposium Digest of Technical Papers", 2012, volume 43, issue 1, pp. 183-186.

SUMMARY OF THE INVENTION

Problems to be Solved by the Invention

Representing data in binary, BNN is capable of multiplication (product) using one XNOR circuit, for example, and thus can reduce the circuit size. However, a conventional logic circuit is used for addition (sum), which inhibited the circuit size from being reduced.

In addition, a photoelectric conversion device in an imaging device sometimes requires high voltage; thus, a transistor that controls the photoelectric conversion device is required to have high breakdown voltage in some cases. A transistor with high breakdown voltage needs to be fabricated through a process with high breakdown voltage, which has been making downscaling of the transistor challenging.

An object of one embodiment of the present invention is to provide an imaging device with an arithmetic function, in which the circuit size of an adder circuit is reduced. Another object of one embodiment of the present invention is to provide an imaging device with an arithmetic function, which includes a downscaled transistor. Another object of one embodiment of the present invention is to provide a novel imaging device with an arithmetic function.

Note that one embodiment of the present invention does not necessarily have to achieve all the above-described objects and only needs to achieve at least one of the objects. The descriptions of the above objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is an imaging device including a plurality of pixel blocks. Each of the pixel blocks includes N (N is an integer greater than or equal to 1) first circuits, N second circuits, and a third circuit. Each of the first circuits includes a photoelectric conversion device, and the photoelectric conversion device has a function of converting incident light into an electrical signal. The K-th (K is an integer greater than or equal to 1 and less than or equal to N) first circuit has a function of outputting a first signal that is obtained by binarizing the electrical signal to the K-th second circuit, and each of the second circuits has a function of outputting a second signal that is obtained by multiplying the first signal by a weight coefficient to the third circuit. The N second signals are added by being output to the wiring electrically connected to the third circuit.

In the above embodiment, the first circuit is stacked over the second circuit.

In the above embodiment, the N first circuits are stacked over the N second circuits and the third circuit.

In the above embodiment, each of the first circuits includes a transistor, and the transistor includes a metal oxide in a channel formation region.

Effect of the Invention

According to one embodiment of the present invention, an imaging device with an arithmetic function in which the circuit size of an adder circuit is reduced can be provided. According to another embodiment of the present invention, an imaging device with an arithmetic function, which includes a downscaled transistor can be provided. According to another embodiment of the present invention, a novel imaging device with an arithmetic function can be provided.

Note that the description of these effects does not preclude the existence of other effects. One embodiment of the present invention does not necessarily have to have all the effects. Effects other than these will be apparent from the descriptions of the specification, the claims, the drawings, and the like, and effects other than these can be derived from the descriptions of the specification, the claims, the drawings, and the like.

3B is a circuit diagram illustrating a configuration example of a pixel.

Figure 4:
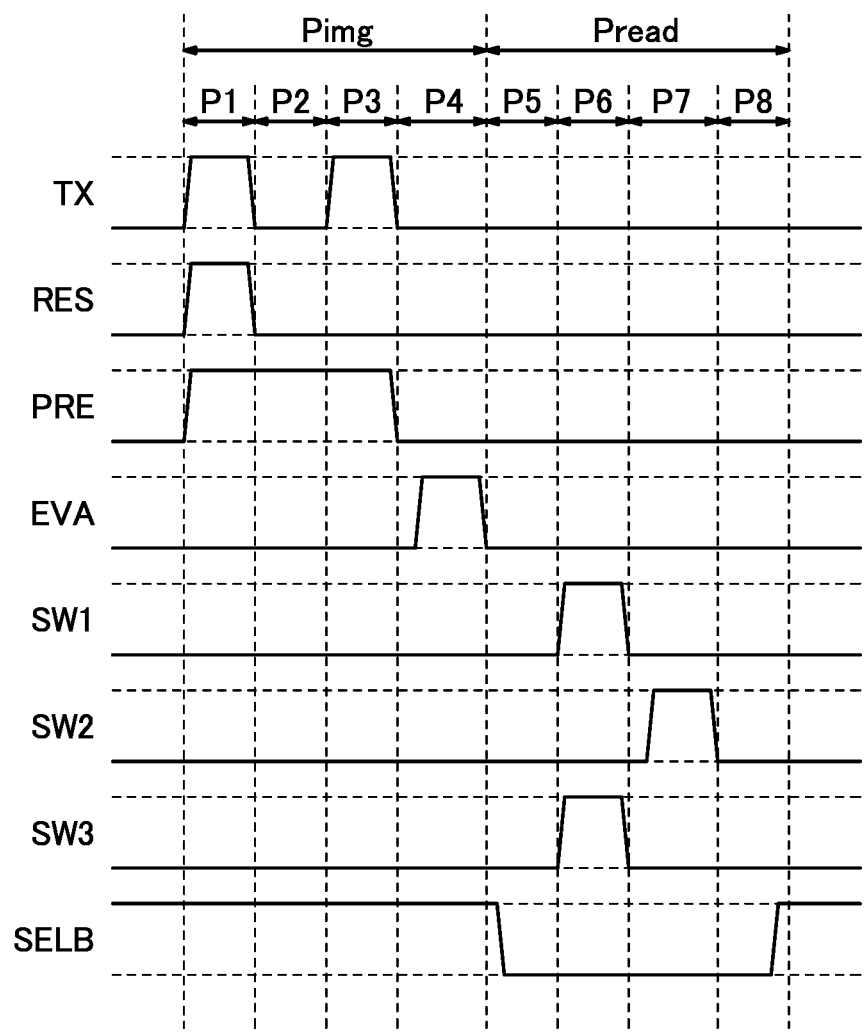

FIG. 4 is a timing chart showing an operation example of a pixel block.

Figure 5A:
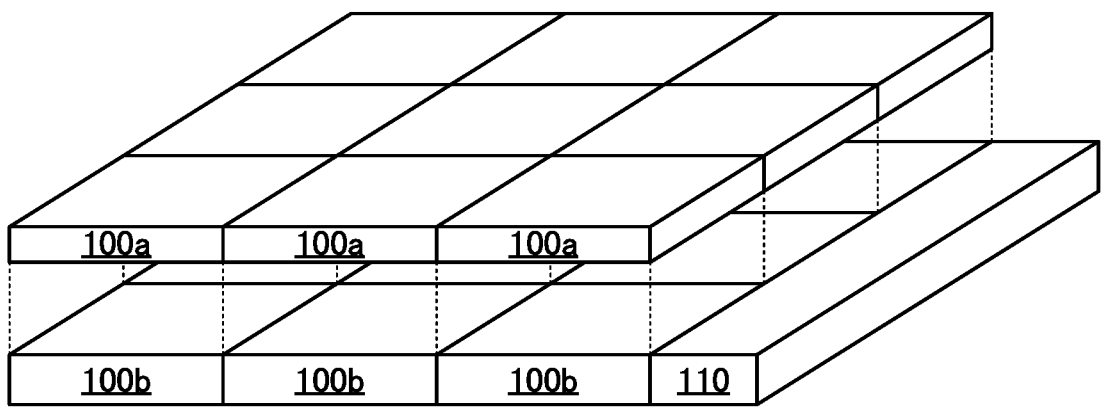
Figure 5B:
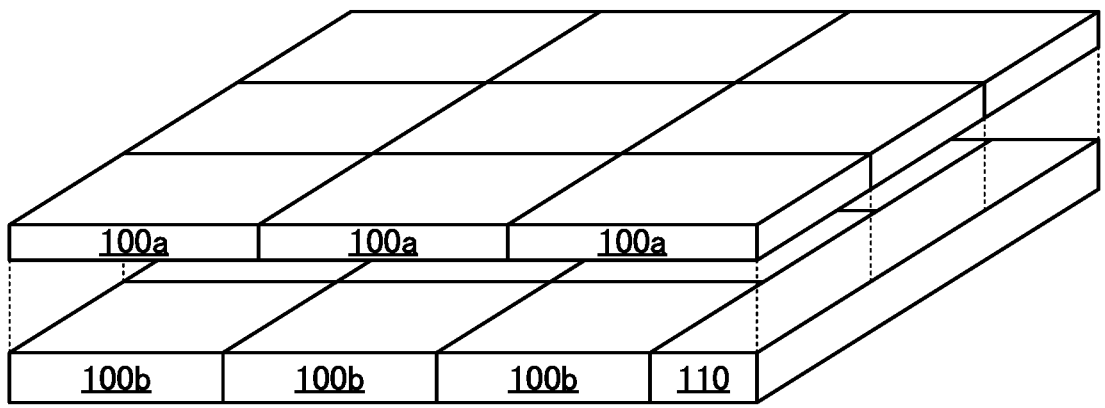

FIG. 5A and FIG. 5B are schematic diagrams illustrating configuration examples of a pixel block.

FIG. 6A to FIG. 6D are diagrams illustrating structures of a pixel of an imaging device.

Figure 7A:
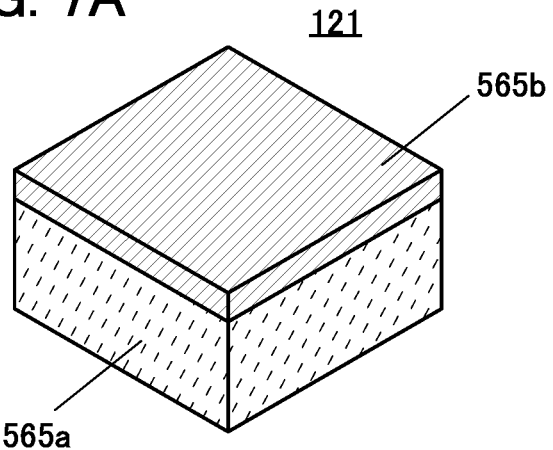
Figure 7B:
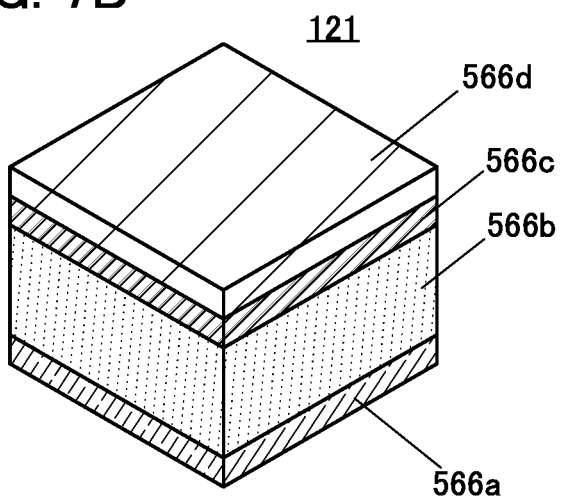
Figure 7C:
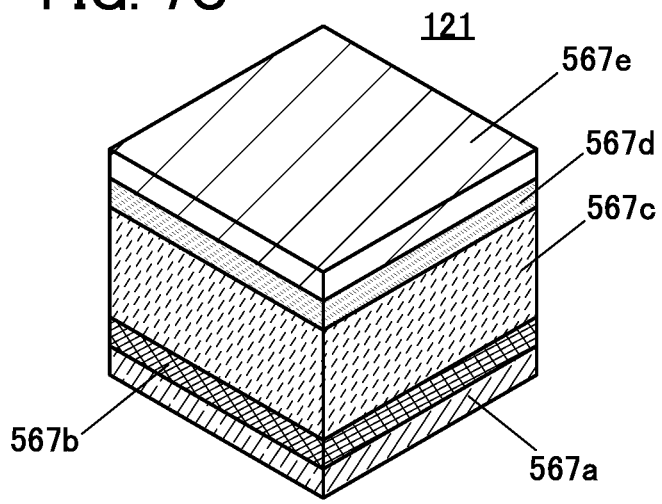

FIG. 7A to FIG. 7C are diagrams illustrating structures of a photoelectric conversion device.

Figure 8:
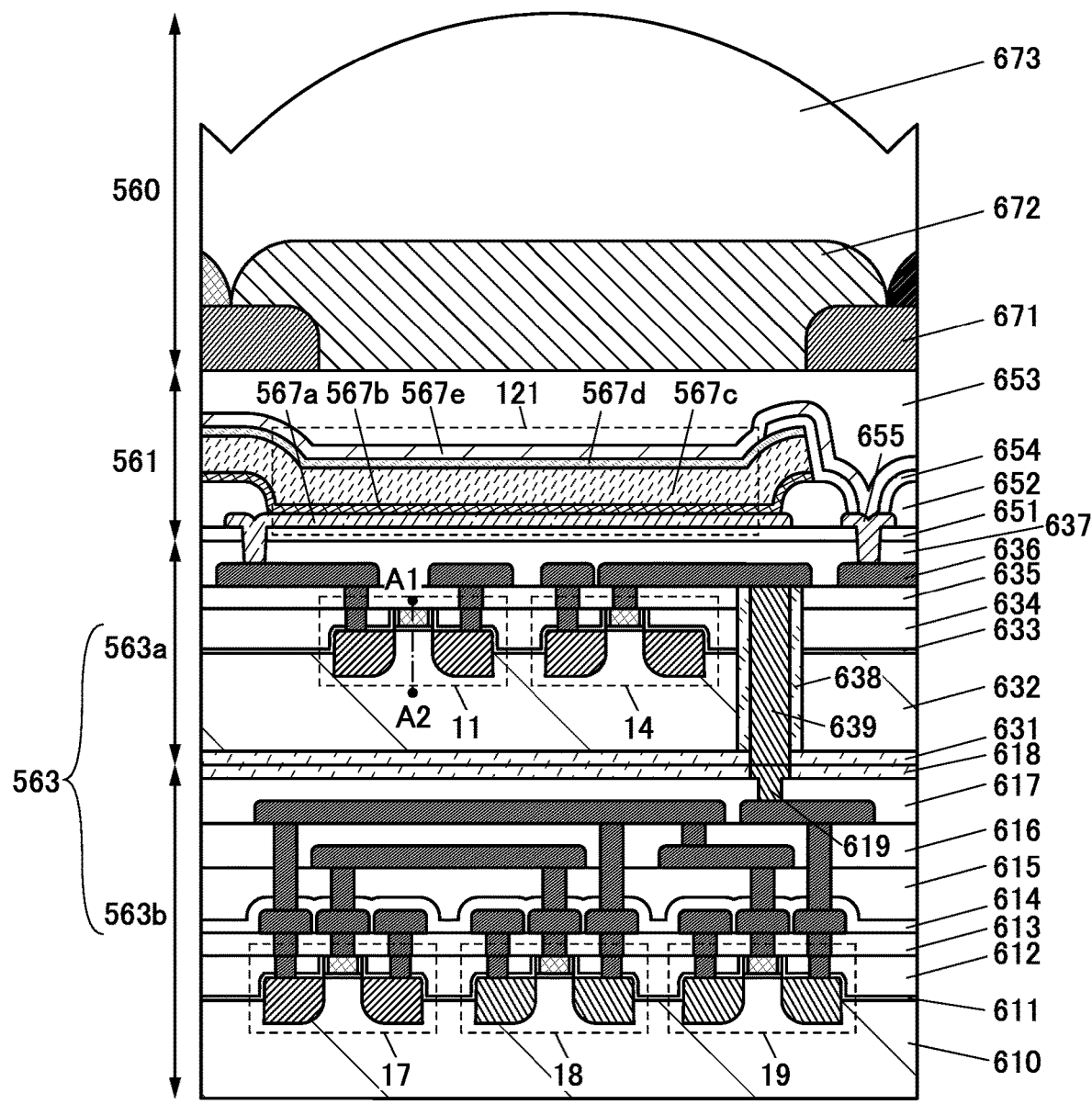

FIG. 8 is a cross-sectional view illustrating a pixel.

Figure 9A:
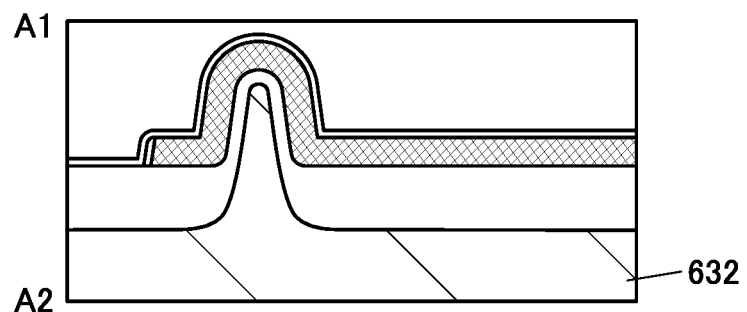
Figure 9B:
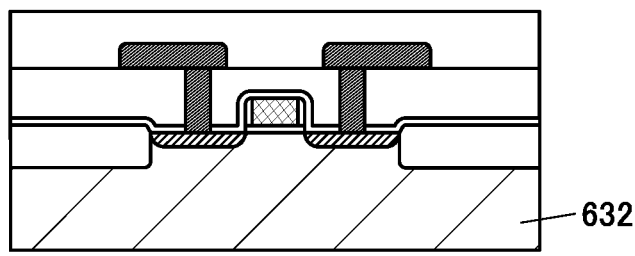
Figure 9C:
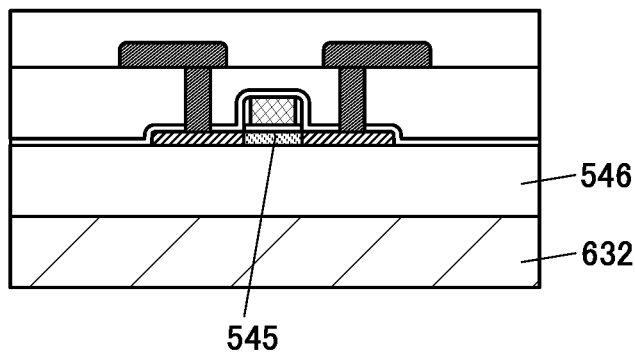

FIG. 9A to FIG. 9C are diagrams illustrating Si transistors.

Figure 10:
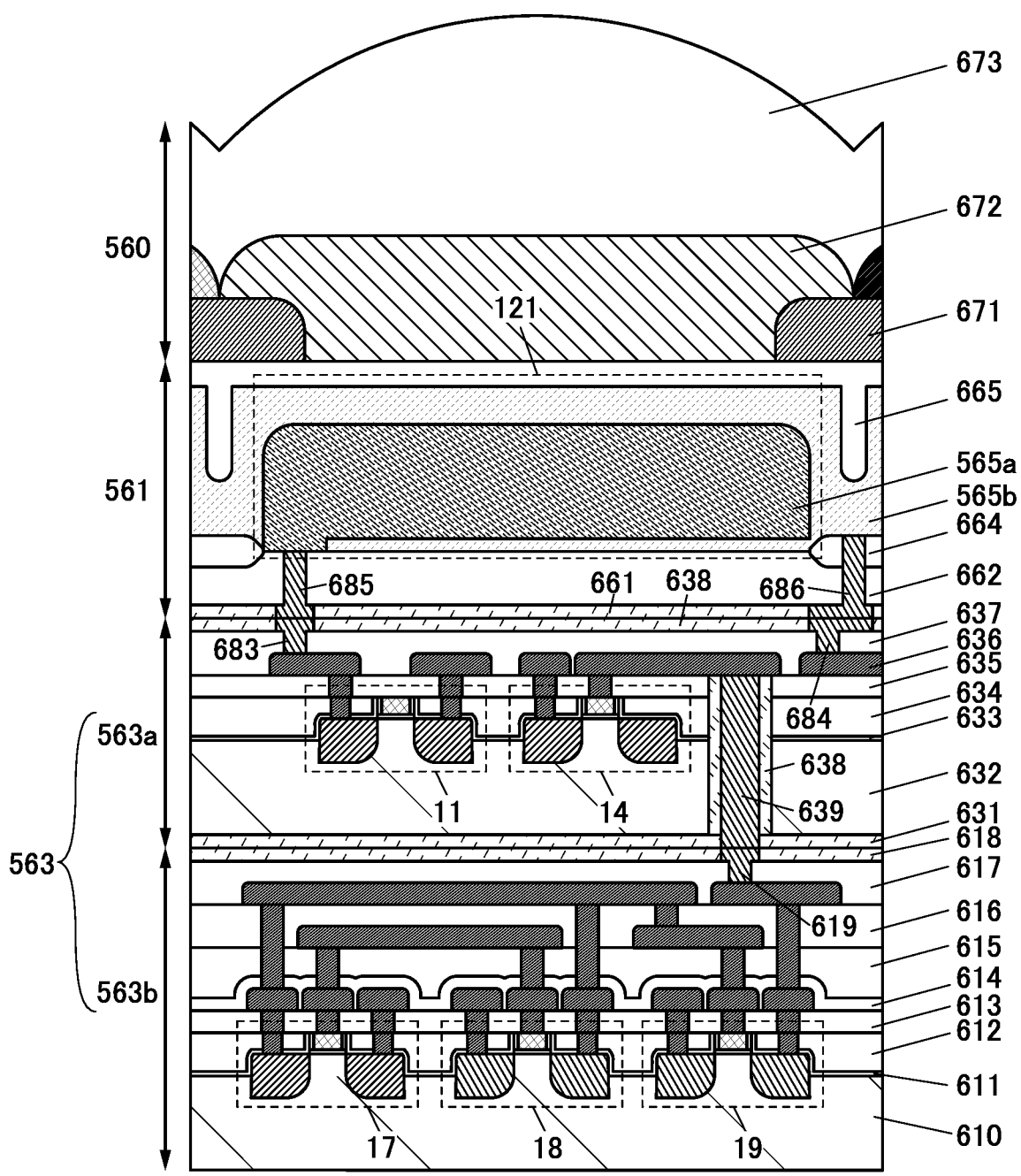

FIG. 10 is a cross-sectional view illustrating a pixel.

Figure 11:
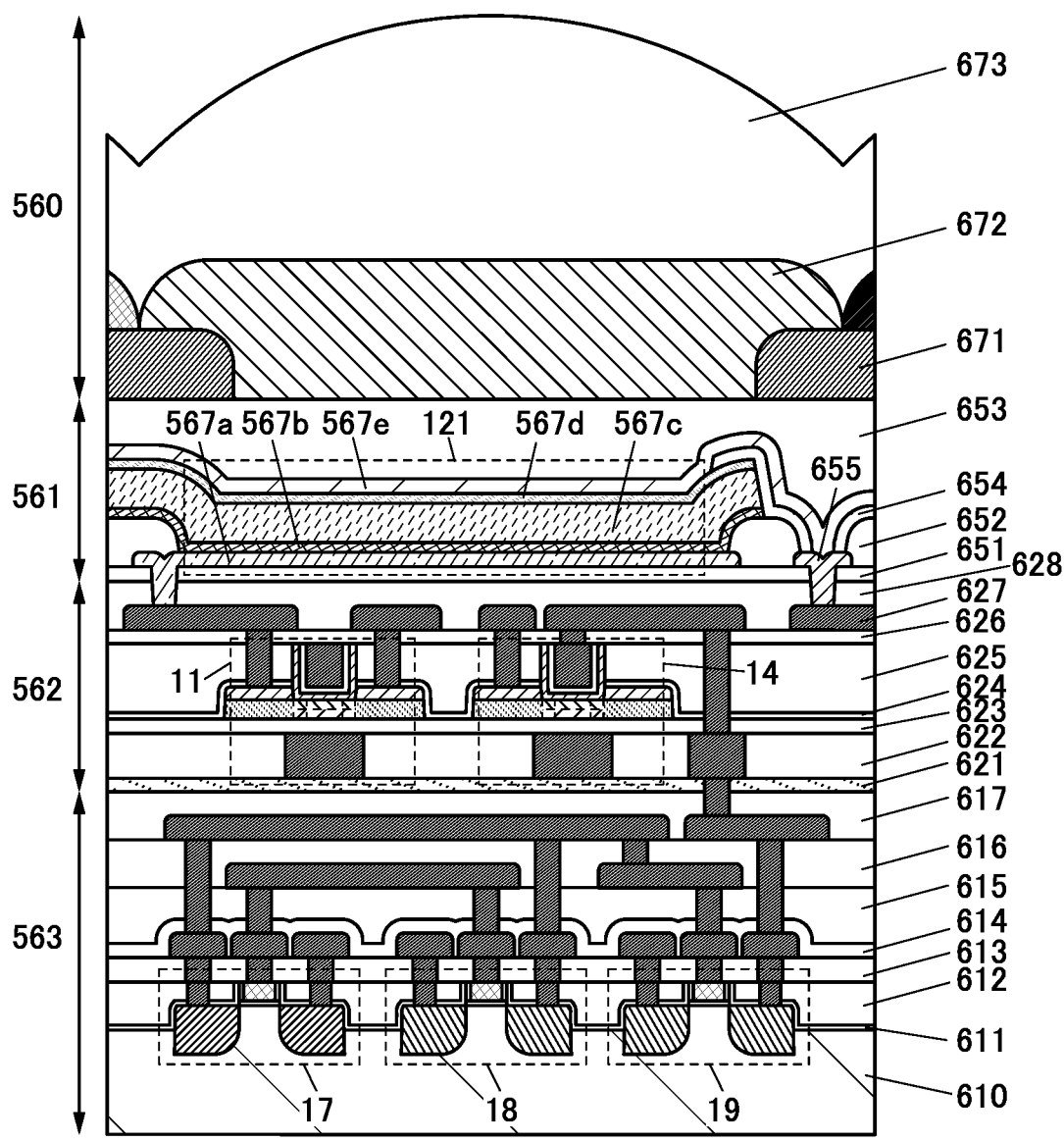

FIG. 11 is a cross-sectional view illustrating a pixel.

FIG. 12A to FIG. 12D are diagrams illustrating OS transistors.

Figure 13:
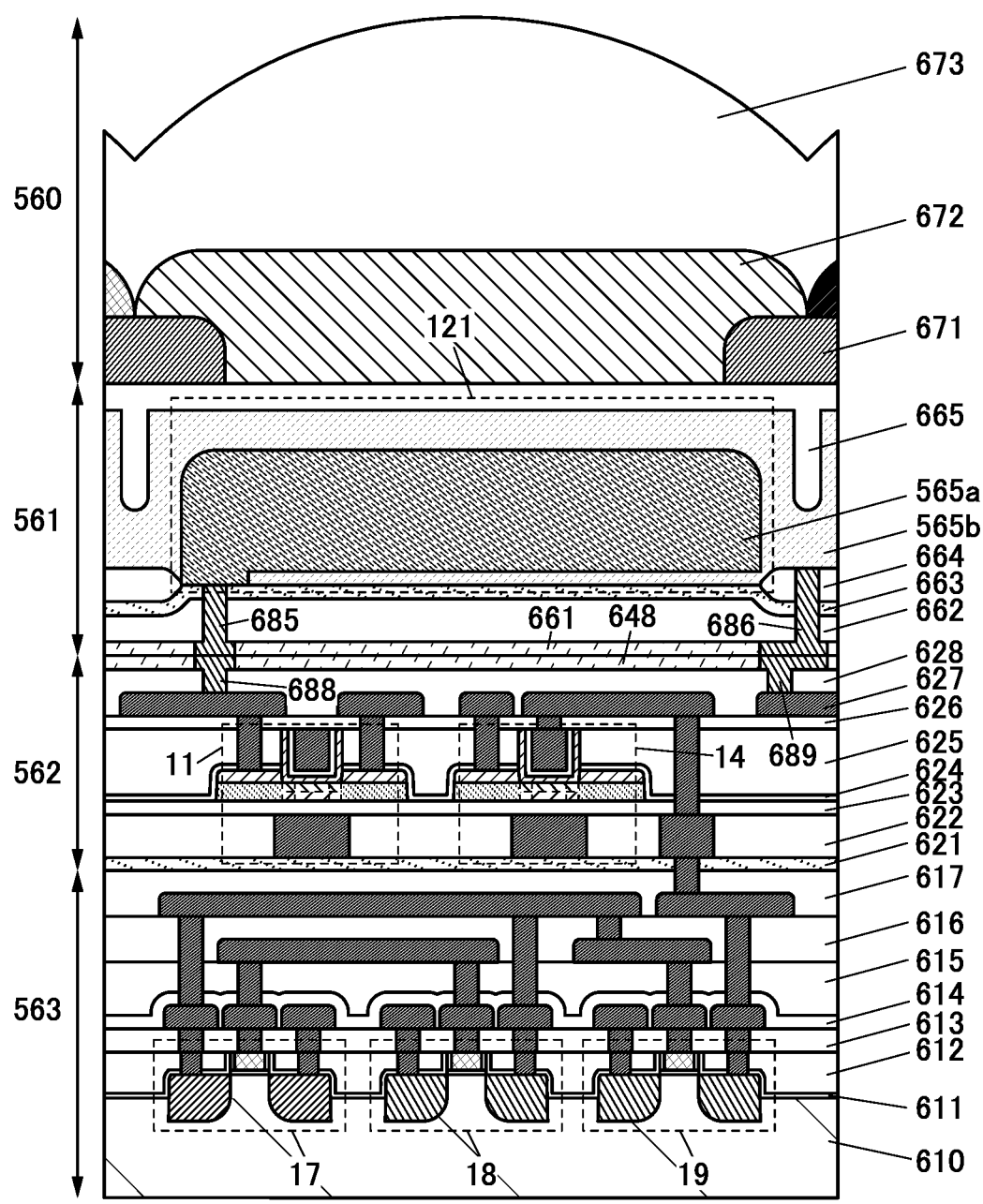

FIG. 13 is a cross-sectional view illustrating a pixel.

Figure 14:
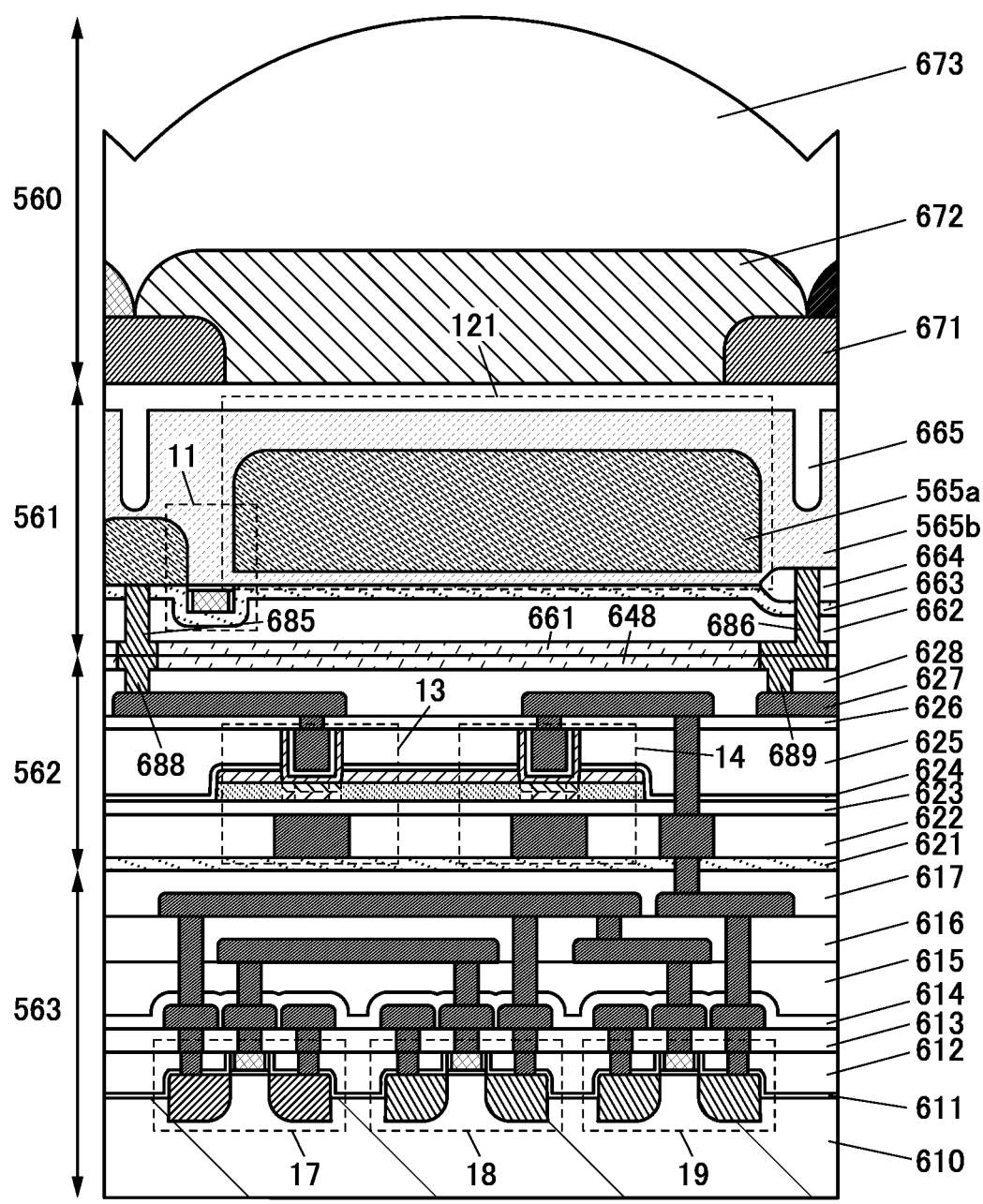

FIG. 14 is a cross-sectional view illustrating a pixel.

Figure 15A:
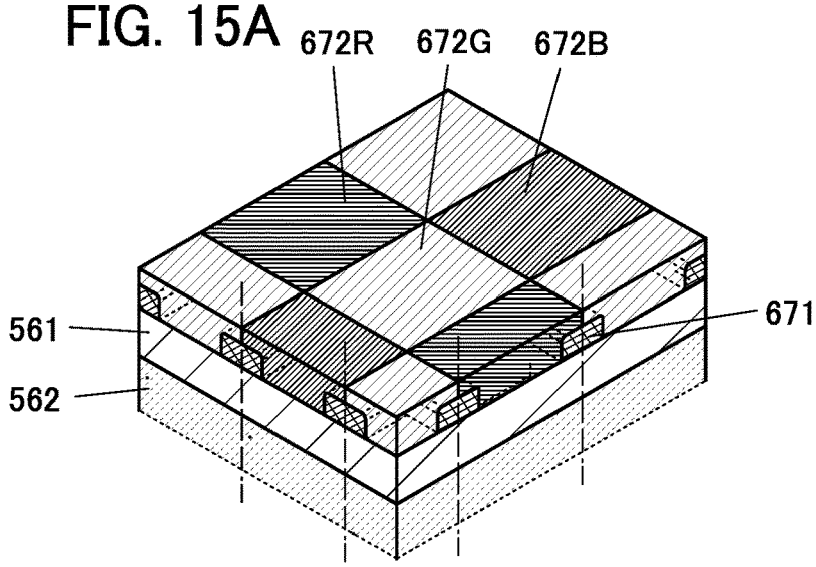
Figure 15B:
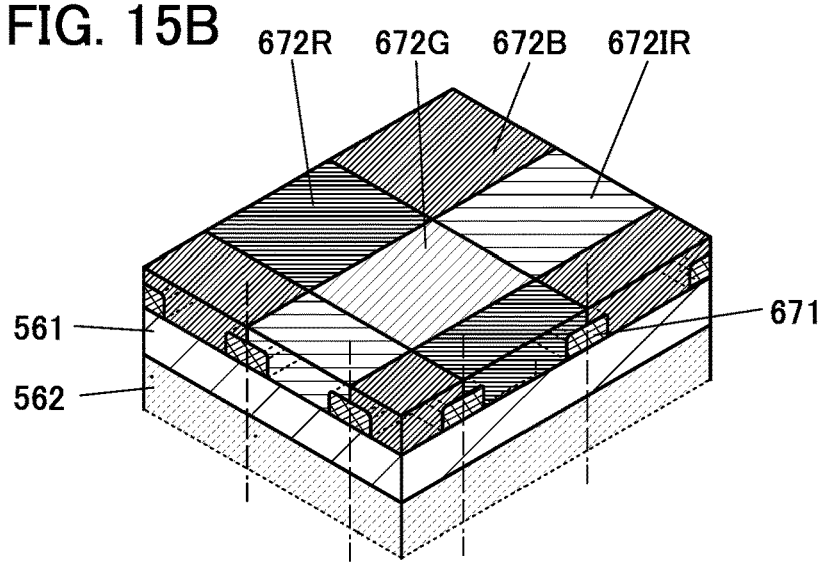
Figure 15C:
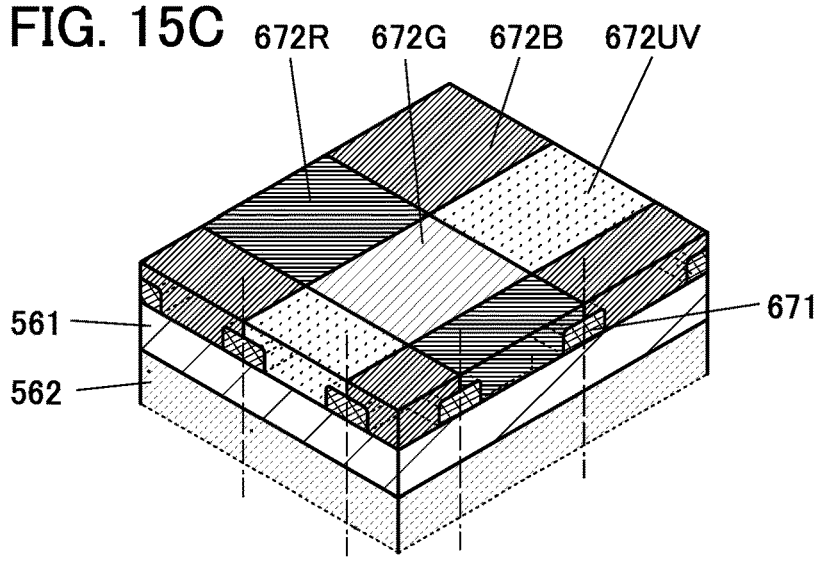

FIG. 15A to FIG. 15C are perspective views (cross-sectional views) illustrating pixels.

FIG. 16A to FIG. 16F are perspective views each illustrating a package or a module including an imaging device.

FIG. 17A to FIG. 17F are diagrams illustrating electronic devices.

MODE FOR CARRYING OUT THE INVENTION

Embodiments will be described below with reference to the drawings. However, the embodiments can be implemented in many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to completely separate actual components according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components are denoted by the same reference signs, and in particular need to be distinguished from each other, an identification sign such as "_1","_2", "[n]", or "[m, n]" is sometimes added to the reference signs. For example, the second wiring GL is referred to as a wiring GL[2].

In this specification and the like, in the case where the maximum value and the minimum value are specified, a structure in which the maximum value and the minimum value are freely combined is disclosed.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitive element, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, an "electrode" or a "terminal" in an electric circuit refers to a portion where a current or a potential is input (or output) or a signal is received (or transmitted). Accordingly, part of a wiring functions as an electrode or a terminal in some cases.

In general, a "capacitive element" has a structure in which two electrodes face each other with an insulator (dielectric) therebetween. Furthermore, in this specification and the like, cases where a "capacitive element" is one having a structure in which two electrodes face each other with an insulator therebetween, one having a structure in which two wirings face each other with an insulator therebetween, or one in which two wirings are positioned with an insulator therebetween, are included. Furthermore, a "capacitive element" is also referred to as a "capacitor" or simply as "capacitance".

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a source, a drain, and a gate. Further, a channel formation region is included between the source (a source terminal, a source region, or a source electrode) and the drain (a drain terminal, a drain region, or a drain electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or the direction of current flow is changed in circuit operation, for example. Thus, the terms of a source and a drain are interchangeable in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when a transistor is in the off state. In addition, a leakage current sometimes expresses the same meaning as the off-state current. Furthermore, in this specification and the like, the off-state current sometimes refers to a current that flows between a source and a drain when a transistor is in the off state.

Furthermore, in this specification and the like, an on-state current sometimes refers to a current that flows between a source and a drain when a transistor is in the on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can be referred to as a metal oxide semiconductor. In other words, a transistor including a metal oxide in a channel formation region can be referred to as an "oxide semiconductor transistor" or an "OS transistor". Similarly, a "transistor using an oxide semiconductor" is also a transistor including a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, configuration examples of an imaging device of embodiments of the present invention will be described.

One embodiment of the present invention is an imaging device with an arithmetic function, and the imaging device has a function of product-sum operation where image data is multiplied by weight coefficients and the results are added, based on the BNN method. Note that the imaging device includes a plurality of pixels, and each of the pixels has a function of converting incident light into an electrical signal; the image data in this embodiment is composed of electrical signals generated by the pixels.

<Configuration Example of Imaging Device>

Figure 1:
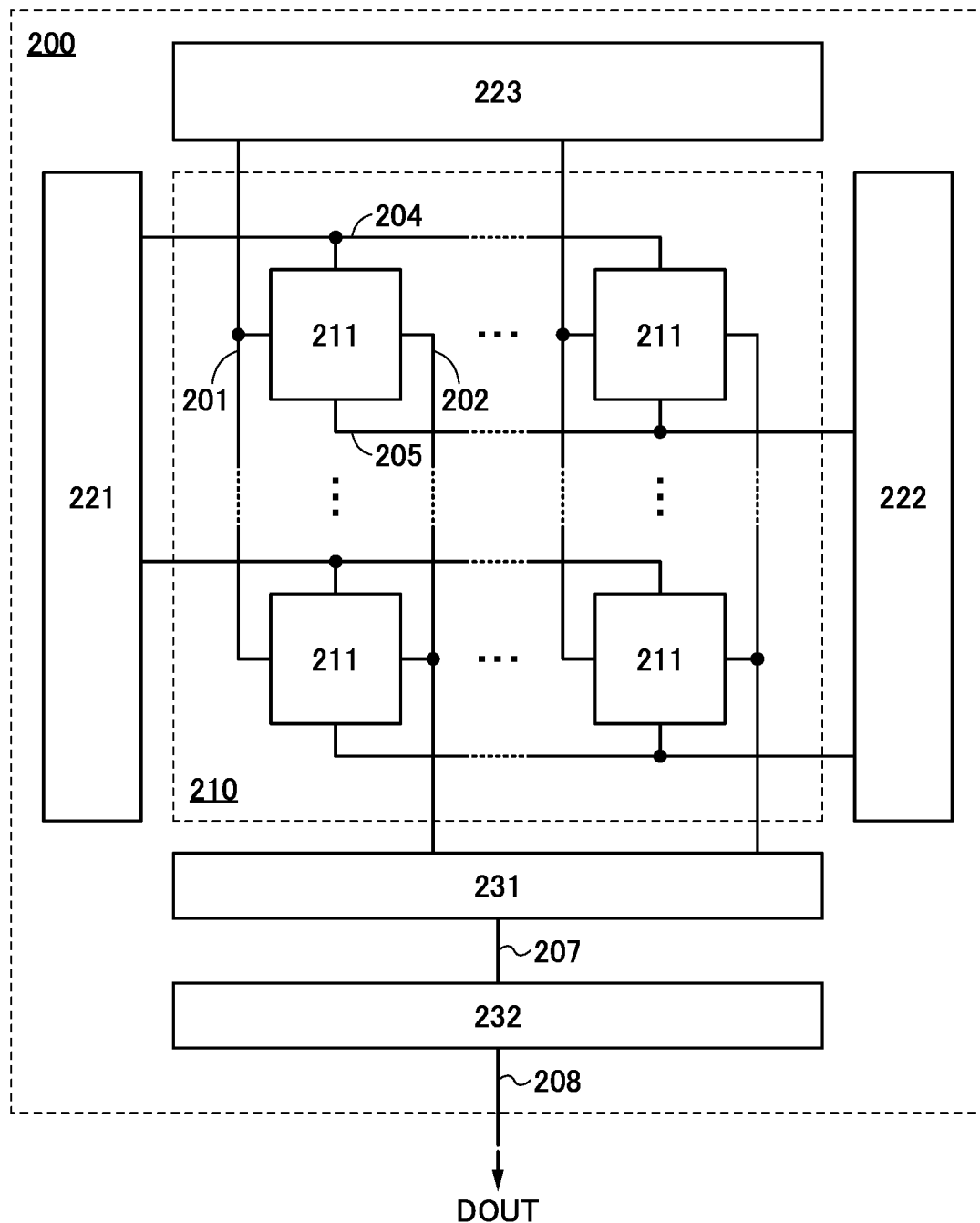
FIG. 1 is a block diagram illustrating a configuration example of an imaging device.

FIG. 1 is a block diagram illustrating a configuration example of an imaging device 200 of one embodiment of the present invention.

The imaging device 200 includes a pixel array 210, a circuit 221, a circuit 222, a circuit 223, a circuit 231, and a circuit 232. The imaging device 200 also includes a wiring 201, a wiring 202, a wiring 204, and a wiring 205. Note that in the drawings described in this specification and the like, the flow of main signals is indicated by an arrow or a line, and a power supply line and the like are omitted in some cases.

In this specification and the like, expressions such as "electrode" or "terminal" are used in order to describe input and output of signals and potentials between components in some cases. Thus, in some cases, physical connecting portions such as "electrode" or "terminal" do not exist in the actual circuit and the components are just electrically connected to each other via wirings or the like.

The pixel array 210 has an imaging function and an arithmetic function. The circuit 221 and the circuit 222 each have a selection function. The circuit 223 has a function of supplying a potential to pixels and a selection function. As the circuit having a selection function, a shift register, a decoder, or the like can be used. Although the circuit 231 and the circuit 232 are not essential components, the circuit 231 may have a function of a correlated double sampling circuit (CDS circuit) and the circuit 232 may have a function of an A/D converter.

The pixel array 210 includes a plurality of pixel blocks 211. Each of the pixel blocks 211 is electrically connected to the circuit 221 through the wiring 204, and is electrically connected to the circuit 222 through the wiring 205. The wiring 204 and the wiring 205 can function as signal lines for controlling the on/off of transistors. Each of the pixel blocks 211 is electrically connected to the circuit 223 through the wiring 201, and is electrically connected to the circuit 231 through the wiring 202.

The circuit 232 is electrically connected to the circuit 231 through a wiring 207, and the circuit 232 has a function of outputting a signal DOUT to the outside of the imaging device 200 through a wiring 208.

Figure 2:
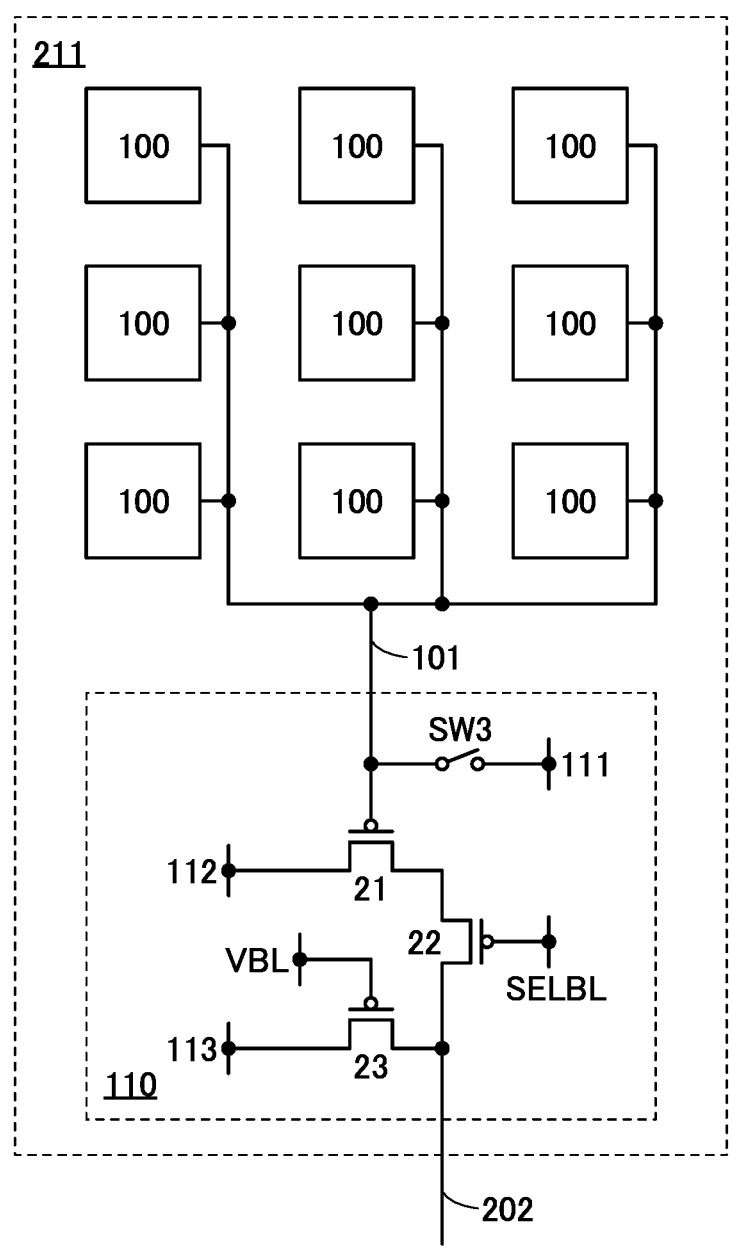
FIG. 2 is a diagram illustrating a configuration example of a pixel block.

As illustrated in FIG. 2, the pixel block 211 includes a plurality of pixels 100 arranged in a matrix and a circuit 110, and each of the pixels 100 is electrically connected to the circuit 110 through a wiring 101.

Each of the pixels 100 includes a photoelectric conversion device, and has a function of converting incident light into an electrical signal (referred to as a first signal). Each of the pixels 100 also has a function of generating a second signal, which is obtained by binarizing the first signal, and has a function of generating a third signal, which is obtained by multiplying the second signal by a weight coefficient.

Although FIG. 2 illustrates an example where the pixel block 211 includes three rows and three columns of (nine) pixels 100, this is just an example and one embodiment of the present invention is not limited thereto. The pixel block 211 may include two rows and two columns of (four) pixels 100, or four rows and four columns of (16) pixels 100, for example. Alternatively, the number of pixels 100 in the row direction and the number of pixels 100 in the column direction may differ from each other. Further alternatively, some of the pixels 100 may be shared by adjacent pixel blocks 211.

The pixels 100 in three rows and three columns each output the third signal obtained by multiplying the second signal by the weight coefficient to the wiring 101, and the third signals output by the pixels 100 to the wiring 101 are added in the wiring 101. The signal generated as a result of adding the third signals in the wiring 101 is an analog signal, which is then read out by the circuit 110 and output to the wiring 202.

The circuit 110 includes a switch SW3 and a transistor 21 to a transistor 23.

A gate of the transistor 21 and one terminal of the switch SW3 are electrically connected to the wiring 101. One of a source and a drain of the transistor 21 is electrically connected to one of a source and a drain of the transistor 22. The other of the source and the drain of the transistor 22 is electrically connected to one of a source and a drain of the transistor 23 and the wiring 202. The transistor 21 to the transistor 23 can be p-channel transistors.

The other terminal of the switch SW3 is electrically connected to a wiring 111. The other of the source and the drain of the transistor 21 is electrically connected to a wiring 112. A gate of the transistor 22 is electrically connected to a wiring SELBL. A gate of the transistor 23 is electrically connected to a wiring VBL, and the other of the source and the drain of the transistor 23 is electrically connected to a wiring 113.

The wiring 111 to the wiring 113 and the wiring VBL can each have a function of a power supply line or a wiring supplied with a potential. For example, the wiring 111 and the wiring VBL can each function as a wiring supplied with a predetermined potential, the wiring 112 can function as a low potential power supply line, and the wiring 113 can function as a high potential power supply line. The predetermined potential supplied to the wiring 111 and the wiring VBL can have a function of an adjustment potential or a bias potential in the circuit 110. The wiring SELBL has a function of a signal line transmitting a signal SELB.

<Configuration Example of Pixel 100>

Figure 3A:
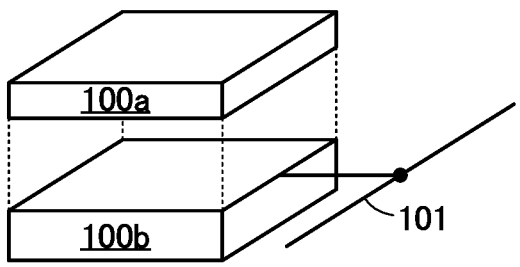
FIG. 3A is a schematic diagram illustrating a configuration example of a pixel. FIG.
Figure 3B:
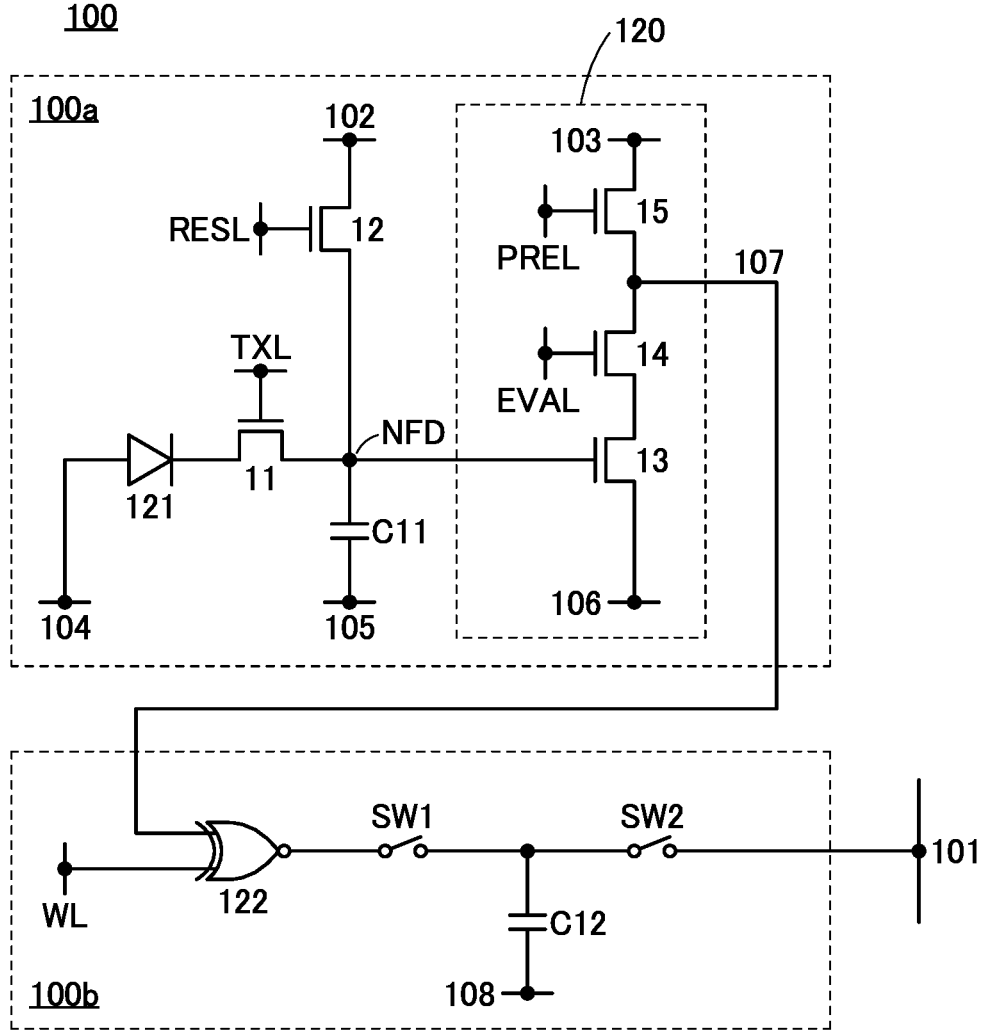

FIG. 3A is a schematic diagram illustrating a configuration example of the pixel 100, and FIG. 3B is a circuit diagram illustrating a configuration example of the pixel 100. The pixel 100 has a configuration in which a circuit 100a is stacked over a circuit 100b, as illustrated in FIG. 3A.

The circuit 100b can be formed using a transistor formed on a substrate, for example. A single crystal semiconductor substrate or a polycrystalline semiconductor substrate using silicon, silicon carbide, or the like as a material, a compound semiconductor substrate using silicon germanium or the like as a material, or the like can be used as the substrate. Furthermore, an SOI substrate, a semiconductor substrate provided with a semiconductor element such as a strained transistor or a FIN-type transistor, a glass substrate of barium borosilicate glass, aluminoborosilicate glass, or the like, a ceramic substrate, a quartz substrate, a sapphire substrate, or the like may be used as the substrate. A flexible substrate may also be used as the substrate. In this embodiment, a case in which a single crystal silicon substrate is used as the substrate is described. Note that a transistor including silicon in a channel formation region is referred to as a Si transistor.

The circuit 100a is preferably formed using an OS transistor. Since an OS transistor can be formed by a method such as a thin-film method, the circuit 100a can be stacked over the circuit 100b. That is, the area of the pixel 100 can be reduced.

Alternatively, the circuit 100a may be formed using a transistor formed on a substrate, in the same way as the circuit 100b. It is possible, for example, to form the circuit 100a using a transistor formed on a substrate different from the one with the circuit 100b, and attach the substrate with the circuit 100b and the substrate with the circuit 100a to each other later.

Here, an oxide semiconductor has a bandgap of 2 eV or larger; thus, an OS transistor has features of low leakage current due to thermal excitation and extremely low off-state current.

An off-state current per micrometer of channel width of an OS transistor can be, for example, lower than or equal to 100 zA/µm, lower than or equal to 10 zA/µm, lower than or equal to 1 zA/µm, or lower than or equal to 10 yA/µm. In addition, an off-state current of an OS transistor is less likely to increase even in a high-temperature environment. An off-state current of an OS transistor hardly increases even at a temperature higher than or equal to room temperature and lower than or equal to 200° C., for example.

An OS transistor also has features of an on-state current less likely to decrease even in a high-temperature environment and high source-drain breakdown voltage. That is, using an OS transistor to form the circuit 100a enables high reliability to be obtained even in a high-temperature environment. Furthermore, using an OS transistor to form the circuit 100a enables the circuit 100a to be a highly reliable circuit even in the case where a photoelectric conversion device (described later) in the circuit 100a requires high voltage.

Furthermore, it is not necessary to use a process with high breakdown voltage for the transistor included in the circuit 100b. The transistor included in the circuit 100b can be downscaled.

A metal oxide used in a channel formation region of the OS transistor is preferably an oxide semiconductor containing at least one of indium (In) and zinc (Zn). Typical examples of such an oxide semiconductor include an In—M—Zn oxide (an element M is Al, Ga, Y, or Sn, for example). Reducing impurities serving as electron donors, such as moisture or hydrogen, and oxygen vacancies can make the oxide semiconductor i-type (intrinsic) or substantially i-type. Such an oxide semiconductor can be referred to as a highly purified oxide semiconductor. The details of the OS transistor will be described in Embodiment 2 and Embodiment 3.

<Circuit 100a>

The circuit 100a includes a photoelectric conversion device 121, a transistor 11 to a transistor 15, and a capacitor C11.

One electrode of the photoelectric conversion device 121 is electrically connected to one of a source and a drain of the transistor 11. The other of the source and the drain of the transistor 11 is electrically connected to one of a source and a drain of the transistor 12, a gate of the transistor 13, and one electrode of the capacitor C11. One of a source or a drain of the transistor 13 is electrically connected to one of a source and a drain of the transistor 14. The other of the source and the drain of the transistor 14 is electrically connected to one of a source and a drain of the transistor 15 and a wiring 107.

The other electrode of the photoelectric conversion device 121 is electrically connected to a wiring 104. The other of the source and the drain of the transistor 12 is electrically connected to a wiring 102. The other electrode of the capacitor C11 is electrically connected to a wiring 105. The other of the source and the drain of the transistor 13 is electrically connected to a wiring 106. The other of the source and the drain of the transistor 15 is electrically connected to a wiring 103.

Note that the wiring 102 to the wiring 106 can each have a function of a power supply line or a wiring supplied with a potential. For example, the wiring 102 and the wiring 103 can each function as a high potential power supply line, the wiring 105 can function as a wiring supplied with a predetermined potential, and the wiring 104 and the wiring 106 can each function as a low potential power supply line. The wiring 102 and the wiring 103 may be electrically connected to each other, and the wiring 104 and the wiring 106 may be electrically connected to each other. Alternatively, the wiring 104 to the wiring 106 may be electrically connected to each other.

A gate of the transistor 11 is electrically connected to a wiring TXL. A gate of the transistor 12 is electrically connected to a wiring RESL. A gate of the transistor 14 is electrically connected to a wiring EVAL. A gate of the transistor 15 is electrically connected to a wiring PREL.

The wiring TXL has a function of a signal line transmitting a signal TX, the wiring RESL has a function of a signal line transmitting a signal RES, the wiring EVAL has a function of a signal line transmitting a signal EVA, and the wiring PREL has a function of a signal line transmitting a signal PRE.

Here, a point where the other of the source and the drain of the transistor 11, the one of the source and the drain of the transistor 12, the one electrode of the capacitor C11, and the gate of the transistor 13 are electrically connected is referred to as a node NFD.

As the photoelectric conversion device 121, a photodiode can be used. There is no limitation on types of photodiodes, and it is possible to use a Si photodiode in which a photoelectric conversion layer contains silicon, an organic photodiode in which a photoelectric conversion layer includes an organic photoconductive film, or the like. Note that in order to increase light detection sensitivity under low illuminance conditions, an avalanche photodiode is preferably used. The photoelectric conversion device 121 may also be a potentiometer with silicon, germanium, selenium, or the like, utilizing the photoelectric effects.

The transistor 12 can have a function of initializing the potential of the node NFD. The transistor 11 can have a function of controlling the potential of the node NFD. The transistor 15 can have a function of initializing the potential of the wiring 107. The transistor 13 and the transistor 14 can each have a function of controlling the potential of the wiring 107. The transistor 11 to the transistor 15 can be n-channel transistors.

The transistor 13 to the transistor 15 can make up a dynamic logic inverter 120. With the transistor 15 initializing the potential of the wiring 107 and with the on/off of the transistor 13 being controlled in accordance with the potential of the node NFD (the first signal), the dynamic logic inverter 120 can have a function of outputting, to the wiring 107, either a high potential power supply supplied via the wiring 103 or a low potential power supply supplied via the wiring 106. In other words, the dynamic logic inverter 120 can output a binarized signal (the second signal).

<Circuit 100b>

The circuit 100b includes an XNOR circuit 122, a switch SW1, a switch SW2, and a capacitor C12.

One input terminal of the XNOR circuit 122 is electrically connected to the wiring 107, the other input terminal of the XNOR circuit 122 is electrically connected to a wiring WL, and an output terminal of the XNOR circuit 122 is electrically connected to one terminal of the switch SW1. The other terminal of the switch SW1 is electrically connected to one electrode of the capacitor C12 and one terminal of the switch SW2. The other terminal of the switch SW2 is electrically connected to the wiring 101.

The other electrode of the capacitor C12 is electrically connected to a wiring 108. The wiring 108 can have a function of a wiring to which a potential is supplied. For example, the wiring 108 can function as a wiring to which a predetermined potential is supplied.

The wiring WL can function as a wiring for supplying a potential corresponding to a weight coefficient. In other words, the XNOR circuit 122 can have a function of outputting the product of the signal output to the wiring 107 (the second signal) multiplied by the weight coefficient. The signal output from the XNOR circuit 122 has a function of controlling the potential of the one electrode of the capacitor C12 when the switch SW1 is on, and the switch SW2 can be turned on after the switch SW1 is turned off. When the switch SW2 is on, the potential of the one electrode of the capacitor C12 (the third signal) is output to the wiring 101.

<Operation Example of Pixel Block>

FIG. 4 is a timing chart showing an operation example of the pixel block 211.

The timing chart in FIG. 4 shows the states of the signal TX, the signal RES, the signal PRE, the signal EVA, the signal SELB, and the switch SW1 to the switch SW3. Note that the signal TX, the signal RES, the signal PRE, the signal EVA, and the signal SELB are each a digital signal represented by a high level or a low level (sometimes represented by High or Low, H or L, 1 or 0, and the like); in the timing chart shown in FIG. 4, the switch SW1 to the switch SW3 are on at a high level and off at a low level.

The timing chart in FIG. 4 shows two separate periods of the pixel block 211, i.e., an imaging period Pimg and a readout period Pread. The imaging period Pimg can further be divided into a period P1 to a period P4, and the readout period Pread can further be divided into a period P5 to a period P8.

In the imaging period Pimg, the switch SW1 to the switch SW3 are off (low level), and the signal SELB is at a high level. In the circuit 110, the transistor 22 is off.

In the period P1 of the imaging period Pimg, the signal TX, the signal RES, and the signal PRE are set to a high level, and the signal EVA is at a low level. With the transistor 12, the potential of the node NFD is initialized by a high potential power supply supplied to the wiring 102. With the transistor 15, the potential of the wiring 107 is initialized by a high potential power supply supplied to the wiring 103. The transistor 14 is off.

In the period P2 of the imaging period Pimg, the signal TX and the signal RES are set to a low level, the signal PRE is at a high level, and the signal EVA is at a low level.

In the period P3 of the imaging period Pimg, the signal TX is set to a high level, and imaging is performed. The signal PRE is at a high level, and the signal RES and the signal EVA are at a low level.

In the period P4 of the imaging period Pimg, the signal TX and the signal PRE are set to a low level, and the signal EVA is set to a high level. The signal RES is at a low level. The transistor 14 is turned on, and the transistor 13 and the transistor 14 set the potential of the wiring 107 to a potential corresponding to the potential of the node NFD.

In the readout period Pread, the signal TX, the signal RES, the signal PRE, and the signal EVA are at a low level. The transistor 11, the transistor 12, the transistor 14, and the transistor 15 are off.

In the period P5 of the readout period Pread, the signal SELB is set to a low level, and the switch SW1 to the switch SW3 are off (low level). In the circuit 110, the transistor 22 is turned on.

In the period P6 of the readout period Pread, the switch SW1 and the switch SW3 are turned on (high level), the switch SW2 is off (low level), and the signal SELB is at a low level. The potential of the one electrode of the capacitor C12 is set to the potential output from the XNOR circuit 122, and the potential of the wiring 101 is set to a predetermined potential supplied to the wiring 111.

In the period P7 of the readout period Pread, the switch SW1 and the switch SW3 are turned off (low level), the switch SW2 is turned on (high level), and the signal SELB is at a low level. In each of the nine pixels 100 in the pixel block 211, the potential of the one electrode of the capacitor C12 is output to the wiring 101. The potentials output to the wiring 101 are added in the wiring 101, whereby an analog signal is generated. The circuit 110 outputs a potential corresponding to the potential of the wiring 101 to the wiring 202.

In the period P8 of the readout period Pread, the switch SW2 is turned off (low level), the signal SELB is set to a high level, and the switch SW1 and the switch SW3 are off (low level). In the circuit 110, the transistor 22 is turned off.

<Imaging Device>

As described above, the imaging device 200 includes a plurality of pixel blocks 211, and the pixel blocks 211 each include a plurality of pixels 100 and the circuit 110. Each of the pixels 100 has a function of converting incident light into an electrical signal (first signal), a function of generating the second signal, which is obtained by binarizing the first signal, and a function of generating the third signal, which is obtained by multiplying the second signal by a weight coefficient. When each of the plurality of pixels 100 outputs the third signal to the wiring 101, the third signals are added in the wiring 101, whereby an analog signal is generated. The analog signal is input to the circuit 110.

In other words, the pixel block 211 can have a function of product-sum operation where the first signal generated from the light entering each of the pixels 100 is multiplied by the weight coefficient, based on the BNN method. The plurality of pixels 100 output the third signals and the analog signal where the third signals are added is generated in the pixel block 211; thus, the circuit size of the adder circuit can be reduced.

In the pixel 100, the circuit 100a with the photoelectric conversion device is formed using an OS transistor, which enables the circuit 100a to be a highly reliable circuit. Furthermore, the transistor included in the circuit 100b can be downscaled. For this reason, although the area of the circuit 100a and the area of the circuit 100b are the same in the schematic view showing the configuration example of the pixel 100 in FIG. 3A, one embodiment of the present invention is not limited to this example. Since the transistor included in the circuit 100b can be downscaled, the area of the circuit 100b can be smaller than the area of the circuit 100a.

A schematic view of a configuration example of the pixel block 211 in the case where the circuit 100a and the circuit 100b are the same in area is shown in FIG. 5A, for example. FIG. 5A shows a state where the circuit 110 is provided outside the pixel 100 because the circuit 100a and the circuit 100b are the same in area. Next, a schematic view of a configuration example of the pixel block 211 in the case where the area of the circuit 100b is smaller than the area of the circuit 100a is shown in FIG. 5B. FIG. 5B shows a state where the nine circuits 100b and the circuit 110 are provided under the nine circuits 100a. Note that what is provided under the nine circuits 100a is not limited to the nine circuits 100b and the circuit 110, and other functional circuits may also be provided.

Note that this embodiment can be implemented in appropriate combination with the other embodiments described in this specification.

Embodiment 2

In this embodiment, structure examples and the like of an imaging device of one embodiment of the present invention will be described.

<Structure Example>

Figure 6A:
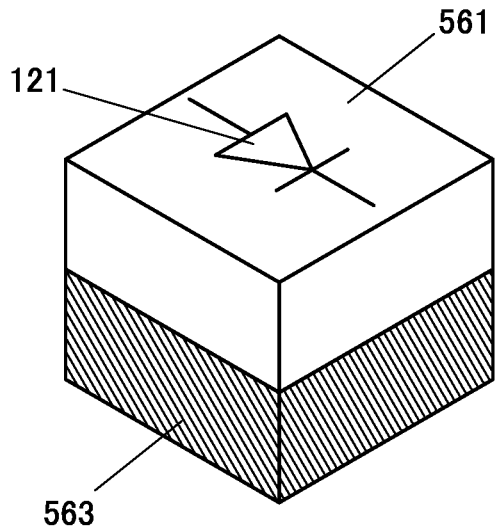

FIG. 6A is a diagram illustrating a structure example of a pixel in the imaging device, and a stacked-layer structure of a layer 561 and a layer 563 can be employed.

The layer 561 includes the photoelectric conversion device 121. The photoelectric conversion device 121 can include a layer 565a and a layer 565b as illustrated in FIG. 7A. Note that a layer may be rephrased as a region, depending on the case.

The photoelectric conversion device 121 illustrated in FIG. 7A is a pn junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn junction photodiode can be formed typically using single crystal silicon.

The photoelectric conversion device 121 included in the layer 561 may have a stack of a layer 566a, a layer 566b, a layer 566c, and a layer 566d as illustrated in FIG. 7B. The photoelectric conversion device 121 illustrated in FIG. 7B is an example of an avalanche photodiode; the layer 566a and the layer 566d correspond to electrodes, and the layer 566b and the layer 566c correspond to a photoelectric conversion portion.

The layer 566a is preferably a low-resistance metal layer or the like. For example, aluminum, titanium, tungsten, tantalum, silver, or a stack thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn junction photodiode containing a selenium-based material in a photoelectric conversion layer can be used for the layer 566b and the layer 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons can be greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

The photoelectric conversion device 121 included in the layer 561 may have a stack of a layer 567a, a layer 567b, a layer 567c, a layer 567d, and a layer 567e as illustrated in FIG. 7C. The photoelectric conversion device 121 illustrated in FIG. 7C is an example of an organic photoconductive film; the layer 567a is a lower electrode, the layer 567e is an upper electrode having a light-transmitting property, and the layer 567b, the layer 567c, and the layer 567d correspond to a photoelectric conversion portion.

One of the layer 567b and the layer 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as C60 or C70, or a derivative thereof can be used, for example.

As the photoelectric conversion layer, a mixed layer of an n-type organic semiconductor and a p-type organic semiconductor (bulk heterojunction structure) can be used.

For the layer 563 illustrated in FIG. 6A, a silicon substrate can be used, for example. The silicon substrate includes a Si transistor or the like. With the use of the Si transistor, a pixel circuit can be formed. In addition, a circuit for driving the pixel circuit, a reading circuit of the pixel circuit, an image processing circuit, a neural network, a communication circuit, or the like can also be formed.

Furthermore, a memory circuit such as a DRAM (Dynamic Random Access Memory), a CPU (Central Processing Unit), an MCU (Micro Controller Unit), or the like may be formed. Note that in this embodiment, the circuit 100a and the circuit 100b described in Embodiment 1 are each referred to as a pixel circuit and the other circuits are each referred to as a functional circuit.

For example, some or all of the transistors included in the circuit 100a, the circuit 100b, and the circuit 110 can be provided in the layer 563.

Figure 6B:
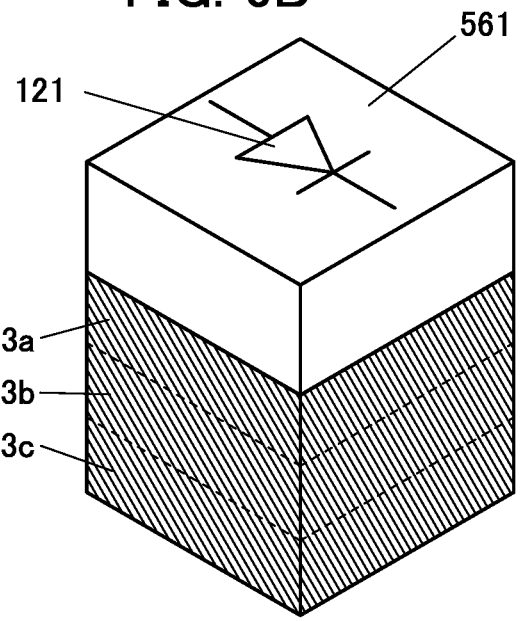

The layer 563 may be a stack of a plurality of layers as illustrated in FIG. 6B. Although FIG. 6B illustrates an example in which the layer 563 is a stack of three layers, a layer 563a, a layer 563b, and a layer 563c, it may be a stack of two layers. Alternatively, the layer 563 may be a stack of four or more layers. These layers can be stacked by a bonding process, for example. With this structure, the pixel circuits and the functional circuits can be dispersed in a plurality of layers; thus, the pixel circuits and the functional circuits can be provided to overlap with each other, which enables a small-sized and high-performance imaging device to be manufactured.

Figure 6C:
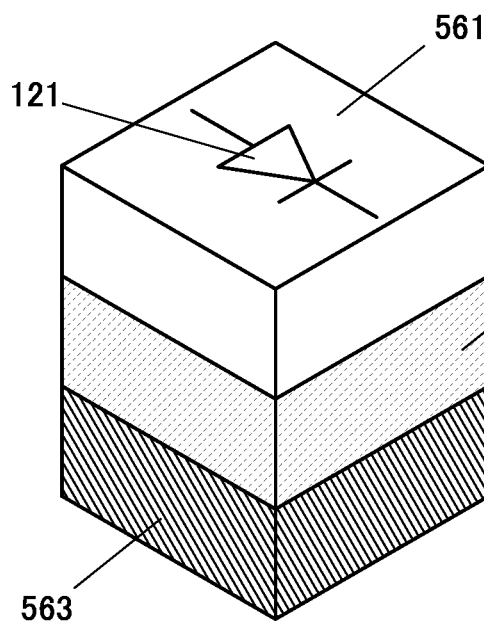

Furthermore, the pixel may have a stacked-layer structure of the layer 561, a layer 562, and the layer 563 as illustrated in FIG. 6C.

The layer 562 can include OS transistors. For example, the circuit 100a can be formed in the layer 562 and the circuit 100b can be formed in the layer 563. One or more of the functional circuits described above may be formed using OS transistors. Alternatively, one or more of the functional circuits may be formed using Si transistors included in the layer 563 and the OS transistors included in the layer 562. Alternatively, the layer 563 may be a support substrate such as a glass substrate, and the pixel circuits and the functional circuits may be formed using the OS transistors included in the layer 562.

A normally-off CPU (also referred to as "Noff-CPU") can be formed using an OS transistor and a Si transistor, for example. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit, which is brought into the standby state because of the stop of power supply, does not consume power. Thus, the power usage of the Noff-CPU can be minimized. Moreover, the Noff-CPU can retain data necessary for setting conditions or the like for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

Figure 6D:
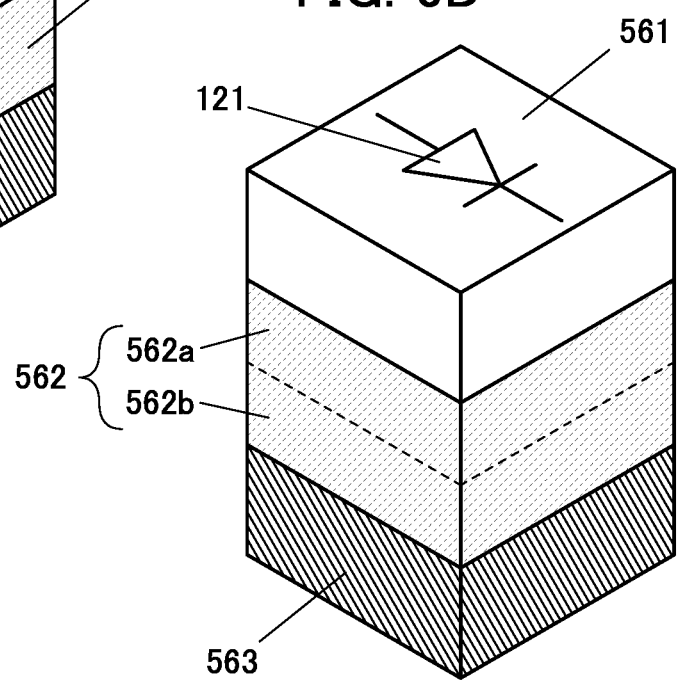

The layer 562 may be a stack of a plurality of layers as illustrated in FIG. 6D. Although FIG. 6D illustrates an example in which the layer 562 is a stack of two layers 562a and 562b, it may be a stack of three or more layers. These layers can be formed to be stacked over the layer 563, for example. Alternatively, the layer 562 may be formed by bonding a layer formed over the layer 563 and a layer formed over the layer 561.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor, and thus enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In—M—Zn-based oxide that contains indium, zinc, and M (M is one or more selected from metals such as aluminum, titanium, gallium, germanium, yttrium, zirconium, lanthanum, cerium, tin, neodymium, and hafnium). The In—M—Zn-based oxide can be formed by a sputtering method, an ALD (Atomic layer deposition) method, or an MOCVD (Metal organic chemical vapor deposition) method, for example. The semiconductor layer may also be formed using ALD utilizing plasma (plasma enhanced ALD (PEALD)).

In the case where the In—M—Zn-based oxide is formed by a sputtering method, the atomic ratio of metal elements in a sputtering target preferably satisfies In M and Zn The atomic ratio of metal elements in such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=10:1:3, or the like. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{11}/cm^3$, and higher than or equal to $1 \times 10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1 \times 10^{18}$ atoms/cm$^3$, preferably lower than or equal to $2 \times 10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5 \times 10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), and a mosaic pattern is formed. Then, $InO_{X1}$ or $In_{X2}Zn_{Y2}O_{Z2}$ forming the mosaic pattern is evenly distributed in the film (this composition is hereinafter also referred to as a cloud-like composition).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including GaO$_{X3}$ or the like as a main component and the region including In$_{X2}$Zn$_{Y2}$O$_{Z2}$ or InO$_{X1}$ as a main component are separated to form a mosaic pattern.

Here, a region including In$_{X2}$Zn$_{Y2}$O$_{Z2}$ or InO$_{X1}$ as a main component is a region whose conductivity is higher than that of a region including GaO$_{X3}$ or the like as a main component. In other words, when carriers flow through the regions including In$_{X2}$Zn$_{Y2}$O$_{Z2}$ or InO$_{X1}$ as a main component, the conductivity of an oxide semiconductor is exhibited. Accordingly, when the regions including In$_{X2}$Zn$_{Y2}$O$_{Z2}$ or InO$_{X1}$ as a main component are distributed in an oxide semiconductor like a cloud, high field-effect mobility (μ) can be achieved.

By contrast, a region including GaO$_{X3}$ or the like as a main component is a region whose insulating property is higher than that of a region including In$_{X2}$Zn$_{Y2}$O$_{Z2}$ or InO$_{X1}$ as a main component. In other words, when the regions including GaO$_{X3}$ or the like as a main component are distributed in an oxide semiconductor, a leakage current can be suppressed and favorable switching operation can be achieved.

Accordingly, when the CAC-OS is used for a semiconductor element, the insulating property derived from GaO$_{X3}$ or the like and the conductivity derived from In$_{X2}$Zn$_{Y2}$O$_{Z2}$ or InO$_{X1}$ complement each other, whereby a high on-state current (Ion) and high field-effect mobility (μ) can be achieved.

A semiconductor element using the CAC-OS has high reliability. Thus, the CAC-OS is suitably used as a constituent material of a variety of semiconductor devices.

<Stacked-Layer Structure 1>

Next, a stacked-layer structure of the imaging device will be described with reference to a cross-sectional view. Note that components such as insulating layers and conductive layers are described below as examples, and other components may be further included. Alternatively, some components described below may be omitted. A stacked-layer structure described below can be formed by a bonding process, a polishing process, or the like as needed.

FIG. 8 is an example of a cross-sectional view of a stack including a layer 560, the layer 561, and the layer 563 and including a bonding surface between the layer 563a and the layer 563b of the layer 563.

<Layer 563b>

The layer 563b includes components of the circuit 100b provided on a silicon substrate 610. Here, a transistor 17, a transistor 18, and a transistor 19 are illustrated as some of the components of the circuit 100b. The transistor 17, the transistor 18, and the transistor 19 can make up the XNOR circuit 122, for example.

The silicon substrate 610 and insulating layers 611, 612, 613, 614, 615, 616, 617, and 618 are provided in the layer 563b. Moreover, a conductive layer 619 is provided. The insulating layer 611 functions as a protective film. The insulating layers 612, 613, 614, 615, 616, and 617 function as interlayer insulating films and planarization films. The insulating layer 618 and the conductive layer 619 function as bonding layers. The conductive layer 619 is electrically connected to the transistor 19.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. The bonding layers will be described later.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 563a>

The layer 563a includes the components of the circuit 100a. Here, the transistor 11 and the transistor 14 are illustrated as some of the components of the circuit 100a. In the cross-sectional view illustrated in FIG. 8, electrical connection between the transistors is not illustrated.

A silicon substrate 632 and insulating layers 631, 633, 634, 635, 637, and 638 are provided in the layer 563a. In addition, conductive layers 636 and 639 are provided.

The insulating layer 631 and the conductive layer 639 function as bonding layers. The insulating layers 634, 635, and 637 function as interlayer insulating films and planarization films. The insulating layer 633 functions as a protective film. The insulating layer 638 has a function of insulating the silicon substrate 632 from the conductive layer 639. The insulating layer 638 can be formed using a material similar to that for another insulating layer. The insulating layer 638 and the insulating layer 631 may be formed using the same material.

The conductive layer 639 is electrically connected to the gate of the transistor 14 and the conductive layer 619. The conductive layer 636 is electrically connected to the wiring 104 (see FIG. 3).

Si transistors illustrated in FIG. 8 are fin-type transistors including channel formation regions in the silicon substrates (the silicon substrates 610 and 632). FIG. 9A illustrates a cross section (a cross section along A1—A2 in the layer 563a in FIG. 8) in the channel width direction. Note that the Si transistors may each be a planar-type transistor as illustrated in FIG. 9B.

Alternatively, as illustrated in FIG. 9C, a transistor including a semiconductor layer 545 of a silicon thin film may be used. The semiconductor layer 545 can be single crystal silicon (SOI (Silicon on Insulator)) formed on an insulating layer 546 on the silicon substrate 632, for example.

<Layer 561>

The layer 561 includes the photoelectric conversion device 121. The photoelectric conversion device 121 can be formed over the layer 563a. FIG. 8 illustrates the photoelectric conversion device 121 having a structure in which the organic photoconductive film illustrated in FIG. 7C is used as the photoelectric conversion layer. Here, the layer 567a is a cathode, and the layer 567e is an anode.

Insulating layers 651, 652, 653, and 654 and a conductive layer 655 are provided in the layer 561.

The insulating layers 651, 653, and 654 function as interlayer insulating films and planarization films. The insulating layer 654 is provided to cover an end portion of the photoelectric conversion device 121, and has a function of preventing a short circuit between the layer 567e and the layer 567a. The insulating layer 652 functions as an element isolation layer. An organic insulating film or the like is preferably used as the element isolation layer.

The layer 567a corresponding to the cathode of the photoelectric conversion device 121 is electrically connected to one of the source and the drain of the transistor 11 included in the layer 563a. The layer 567e corresponding to the anode of the photoelectric conversion device 121 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can suppress entry of light into an adjacent pixel. As the light-blocking layer 671, a metal layer of aluminum, tungsten, or the like can be used. The metal layer and a dielectric film functioning as an anti-reflection film may be stacked.

A color filter can be used as the optical conversion layer 672. When colors of (red), G (green), B (blue), Y (yellow), C (cyan), M (magenta), and the like are assigned to the color filters of different pixels, a color image can be obtained. For example, as illustrated in a perspective view (including a cross section) of FIG. 15A, a color filter 672R (red), a color filter 672G (green), and a color filter 672B (blue) can be assigned to different pixels.

When a polarization element is used as the optical conversion layer 672, an imaging element can capture an image composed of light oscillating in a specific direction. Furthermore, when arithmetic processing is performed with the use of the circuit 100a, the circuit 100b, and the circuit 110, inspection of an object surface with a neural network can be carried out with high efficiency, for example.

When a wavelength cut filter is used as the optical conversion layer 672, the imaging device can capture images in various wavelength regions.

For example, when an infrared filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When an ultraviolet filter that blocks light having a wavelength longer than or equal to that of visible light is used as the optical conversion layer 672, an ultraviolet imaging device can be obtained.

Note that different optical conversion layers may be provided in one imaging device. For example, as illustrated in FIG. 15B, the color filter 672R (red), the color filter 672G (green), the color filter 672B (blue), and an infrared filter 672IR can be assigned to different pixels. With this structure, a visible light image and an infrared light image can be obtained simultaneously.

Alternatively, as illustrated in FIG. 15C, the color filter 672R (red), the color filter 672G (green), the color filter 672B (blue), and an ultraviolet filter 672UV can be assigned to different pixels. With this structure, a visible light image and an ultraviolet light image can be obtained simultaneously.

Furthermore, when a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 121 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, $BaFCl$:Eu, NaI, CsI, $CaF_2$, $BaF_2$, $CeF_3$, LiF, LiI, ZnO, or the like is dispersed can be used.

The microlens array 673 is provided over the optical conversion layer 672. Light passing through an individual lens of the microlens array 673 goes through the optical conversion layer 672 directly under the lens, and the photoelectric conversion device 121 is irradiated with the light. With the microlens array 673, collected light can be incident on the photoelectric conversion device 121; thus, photoelectric conversion can be efficiently performed. The microlens array 673 is preferably formed using a resin, glass, or the like having a high light transmitting property with respect to light with a wavelength subjected to imaging.

<Bonding>

Next, bonding of the layer 563b and the layer 563a will be described.

The insulating layer 618 and the conductive layer 619 are provided in the layer 563b. The conductive layer 619 includes a region embedded in the insulating layer 618. Furthermore, the surfaces of the insulating layer 618 and the conductive layer 619 are planarized to be level with each other.

The insulating layer 631 and the conductive layer 639 are provided in the layer 563a. The conductive layer 639 includes a region embedded in the insulating layer 631. Furthermore, the surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layers 619 and 639, Cu, Al, Sn, Zn, W, Ag, Pt, or Au can be used, for example. Preferably, Cu, Al, W, or Au is used for easy bonding. In addition, for the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding can be performed at the boundary between the layer 563b and the layer 563a.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

Through the above bonding, the electrical connection between the conductive layer 619 and the conductive layer 639 can be obtained. Moreover, the connection between the insulating layer 618 and the insulating layer 631 with mechanical strength can be obtained.

For bonding metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 563b and the layer 563a are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the components included in the layer 563b to be electrically connected to the components included in the layer 563a.

<Modification Example of Stacked-Layer Structure 1>

FIG. 10 is a modification example of the stacked-layer structure illustrated in FIG. 8 and differs from FIG. 8 in the structure of the photoelectric conversion device 121 included in the layer 561 and part of the structure of the layer 563a; a bonding surface is also included between the layer 561 and the layer 563a.

The layer 561 includes the photoelectric conversion device 121, insulating layers 661, 662, 664, and 665, and conductive layers 685 and 686.

The photoelectric conversion device 121 is a pn junction photodiode formed on a silicon substrate and includes the layer 565b corresponding to a p-type region and the layer 565a corresponding to an n-type region. The photoelectric conversion device 121 is a pinned photodiode, which can suppress a dark current and reduce noise with the thin p-type region (part of the layer 565b) provided on the surface side (current extraction side) of the layer 565a.

The insulating layer 661 and the conductive layers 685 and 686 function as bonding layers. The insulating layer 662 functions as an interlayer insulating film and a planarization film. The insulating layer 664 functions as an element isolation layer. The insulating layer 665 has a function of suppressing carrier leakage.

The silicon substrate is provided with a groove that separates pixels, and the insulating layer 665 is provided on the top surface of the silicon substrate and in the groove. The insulating layer 665 can suppress leakage of carriers generated in the photoelectric conversion device 121 to an adjacent pixel. The insulating layer 665 also has a function of suppressing entry of stray light. Therefore, color mixture can be suppressed with the insulating layer 665. Note that an anti-reflection film may be provided between the top surface of the silicon substrate and the insulating layer 665.

The element isolation layer can be formed by a LOCOS (LOCal Oxidation of Silicon) method. Alternatively, an STI (Shallow Trench Isolation) method or the like may be used to form the element isolation layer. As the insulating layer 665, for example, an inorganic insulating film of silicon oxide, silicon nitride, or the like or an organic insulating film of polyimide, acrylic, or the like can be used. The insulating layer 665 may have a multilayer structure. Note that a structure without the element isolation layer may also be employed.

The layer 565a (corresponding to the n-type region and the cathode) of the photoelectric conversion device 121 is electrically connected to the conductive layer 685. The layer 565b (corresponding to the p-type region and the anode) is electrically connected to the conductive layer 686. The conductive layers 685 and 686 each include a region embedded in the insulating layer 661. Furthermore, the surfaces of the insulating layer 661 and the conductive layers 685 and 686 are planarized to be level with each other.

In the layer 563a, the insulating layer 638 is formed over the insulating layer 637. In addition, a conductive layer 683 electrically connected to one of the source and the drain of the transistor 11 and a conductive layer 684 electrically connected to the conductive layer 636 are formed.

The insulating layer 638 and the conductive layers 683 and 684 function as bonding layers. The conductive layers 683 and 684 each include a region embedded in the insulating layer 638. Furthermore, the surfaces of the insulating layer 638 and the conductive layers 683 and 684 are planarized to be level with each other.

Here, the conductive layers 683, 684, 685, and 686 are the same bonding layers as the above-described conductive layers 619 and 639. The insulating layers 638 and 661 are the same bonding layers as the above-described insulating layers 618 and 631.

Thus, when the conductive layer 683 and the conductive layer 685 are bonded to each other, the layer 565a (corresponding to the n-type region and the cathode) of the photoelectric conversion device can be electrically connected to the one of the source and the drain of the transistor 11. In addition, when the conductive layer 684 and the conductive layer 686 are bonded to each other, the layer 565b (corresponding to the p-type region and the anode) of the photoelectric conversion device can be electrically connected to the wiring 104 (see FIG. 3). When the insulating layer 638 and the insulating layer 661 are bonded to each other, electrical bonding and mechanical bonding of the layer 561 and the layer 563a can be performed.

<Stacked-Layer Structure 2>

FIG. 11 is an example of a cross-sectional view of a stack including the layers 560, 561, 562, and 563 and not including a bonding surface. Si transistors are provided in the layer 563. OS transistors are provided in the layer 562. Note that the structures of the layer 563, the layer 561, and the layer 560 are not described here because they are the same as the structures illustrated in FIG. 8.

<Layer 562>

The layer 562 is formed over the layer 563. The layer 562 includes OS transistors. Here, the transistor 11 and the transistor 14 are illustrated as some of the components of the circuit 100a. In the cross-sectional view illustrated in FIG. 11, electrical connection between the transistors is not illustrated.

Insulating layers 621, 622, 623, 624, 625, 626, and 628 are provided in the layer 562. Moreover, a conductive layer 627 is provided. The conductive layer 627 can be electrically connected to the wiring 104 (see FIG. 3).

The insulating layer 621 functions as a blocking layer. The insulating layers 622, 623, 625, 626, and 628 function as interlayer insulating films and planarization films. The insulating layer 624 has a function of a protective film.

As the blocking layer, a film that has a function of preventing hydrogen diffusion is preferably used. In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

The gate of the transistor 14 is electrically connected to the wiring EVAL.

The one of the source and the drain of the transistor 11 is electrically connected to the layer 567a of the photoelectric conversion device 121 included in the layer 561. The conductive layer 627 is electrically connected to the layer 567e of the photoelectric conversion device 121 included in the layer 561.

Figure 12A:
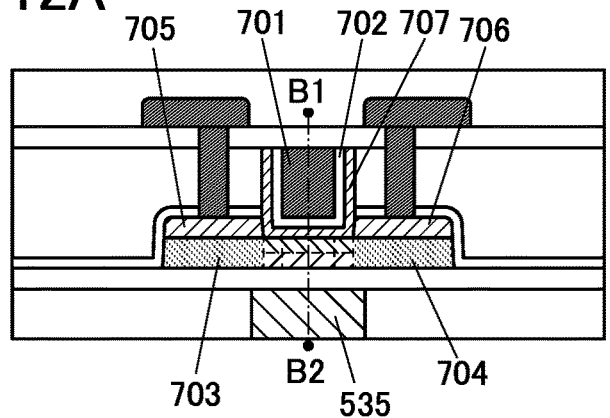

The details of an OS transistor are illustrated in FIG. 12A. The OS transistor illustrated in FIG. 12A has a self-aligned structure in which a source electrode 705 and a drain electrode 706 are formed through provision of an insulating layer over stacked layers of an oxide semiconductor layer and a conductive layer and provision of opening portions reaching the oxide semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The opening portion may further be provided with an oxide semiconductor layer 707.

Figure 12B:
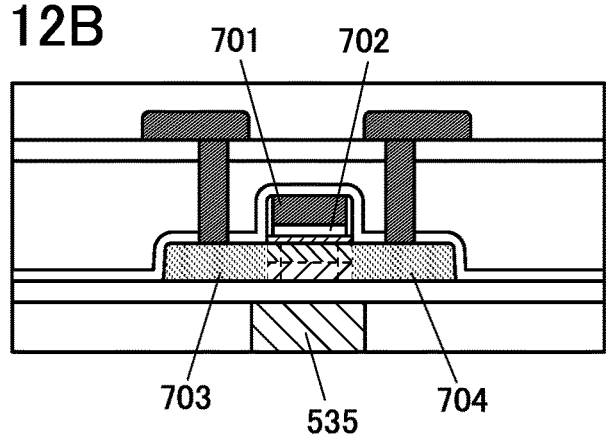

As illustrated in FIG. 12B, the OS transistor may have a self-aligned structure in which the source region 703 and the drain region 704 are formed in the semiconductor layer with the gate electrode 701 as a mask.

Figure 12C:
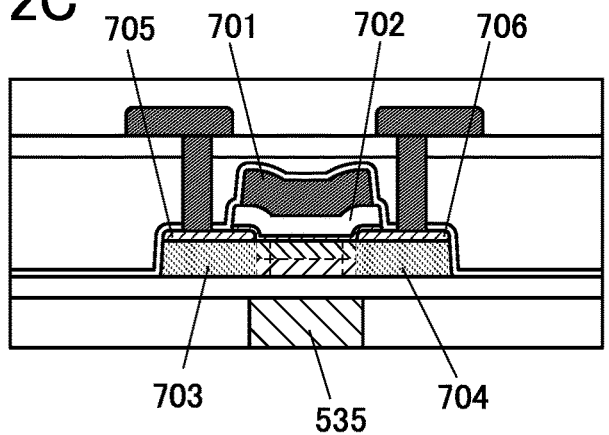

As illustrated in FIG. 12C, the OS transistor may be a non-self-aligned top-gate transistor including a region where the source electrode 705 or the drain electrode 706 overlaps with the gate electrode 701.

Figure 12D:
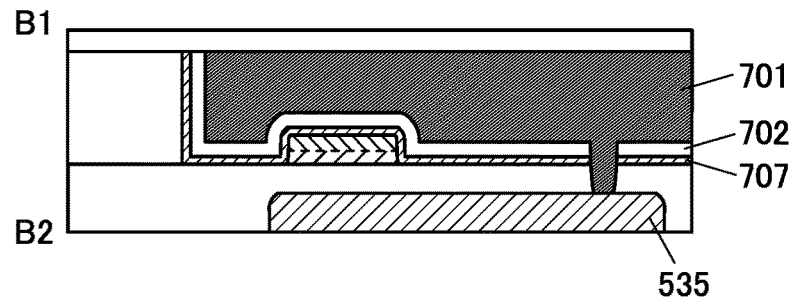

Although the OS transistor has a structure with a back gate 535, it may have a structure without a back gate. As illustrated in a cross-sectional view of the transistor in the channel width direction in FIG. 12D, the back gate 535 may be electrically connected to a front gate of the transistor, which is provided to face the back gate. Note that FIG. 12D illustrates an example of a B1—B2 cross section of the transistor in FIG. 12A, and the same applies to a transistor having any of the other structures. A structure where a fixed potential different from the potential supplied to the front gate is supplied to the back gate 535 may be employed.

<Modification Example 1 of Stacked-Layer Structure 2>

FIG. 13 is a modification example of the stacked-layer structure illustrated in FIG. 11 and differs from FIG. 11 in the structure of the photoelectric conversion device 121 included in the layer 561 and part of the structure of the layer 562; a bonding surface is included between the layer 561 and the layer 562.

The photoelectric conversion device 121 included in the layer 561 is a pn junction photodiode and has a structure similar to that illustrated in FIG. 10.

In the layer 562, an insulating layer 648 is formed over the insulating layer 628. In addition, a conductive layer 688 electrically connected to the one of the source and the drain of the transistor 11 and a conductive layer 689 electrically connected to the conductive layer 627 are formed.

The insulating layer 648 and the conductive layers 688 and 689 function as bonding layers. The conductive layers 688 and 689 each include a region embedded in the insulating layer 648. Furthermore, the surfaces of the insulating layer 648 and the conductive layers 688 and 689 are planarized to be level with each other.

Here, the conductive layers 688 and 689 are bonding layers like the above-described conductive layers 619 and 639. The insulating layer 648 is a bonding layer like the above-described insulating layers 618 and 631.

Thus, when the conductive layer 688 and the conductive layer 685 are bonded to each other, the layer 565a (corresponding to the n-type region and the cathode) of the photoelectric conversion device can be electrically connected to the one of the source and the drain of the transistor 11. In addition, when the conductive layer 689 and the conductive layer 686 are bonded to each other, the layer 565b (corresponding to the p-type region and the anode) of the photoelectric conversion device can be electrically connected to the wiring 104 (see FIG. 3). When the insulating layer 648 and the insulating layer 661 are bonded to each other, electrical bonding and mechanical bonding of the layer 561 and the layer 562 can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. An OS transistor can be formed to be stacked over a silicon substrate on which a device is formed, and thus a bonding step can be skipped.

<Modification Example 2 of Stacked-Layer Structure 2>

FIG. 14 is a modification example of the stacked-layer structure illustrated in FIG. 13 and differs from FIG. 13 in the structure of the layer 561 and part of the structure of the layer 562; a bonding surface is included between the layer 561 and the layer 562.

This modification example has a structure in which the transistor 11 included in the circuit 100a is provided in the layer 561. The transistor 11 is formed of a Si transistor in the layer 561. The one of the source and the drain of the transistor 11 is directly connected to the photoelectric conversion device 121 and the other of the source and the drain of the transistor 11 functions as the node NFD.

In that case, the transistors other than at least the transistor 11 included in the circuit 100a are provided in the layer 562. FIG. 14 illustrates an example in which the transistor 13 and the transistor 14 are provided.

<Package, Module>

Figure 16A:
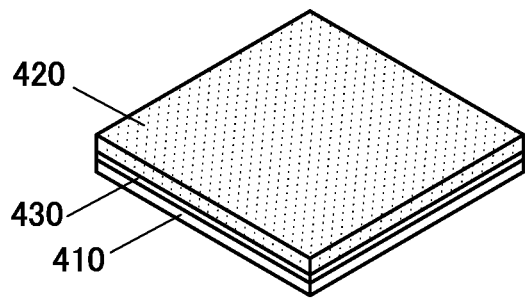

FIG. 16A is an external perspective view of the top surface side of a package in which an image sensor chip is placed. The package includes a package substrate 410 to which an image sensor chip 450 (see FIG. 16C) is fixed, a cover glass 420, an adhesive 430 for bonding them, and the like.

Figure 16D:
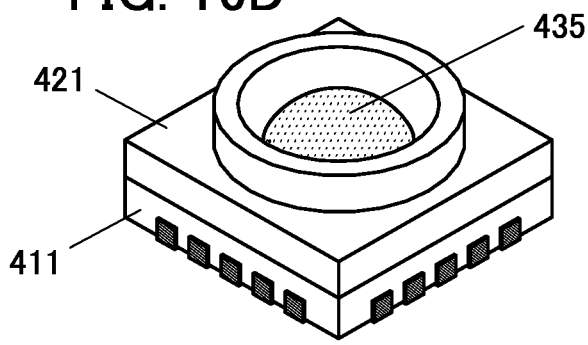
Figure 16B:
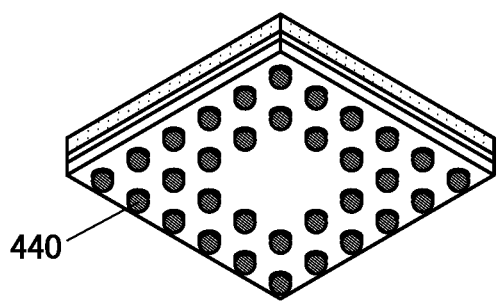

FIG. 16B is an external perspective view of the bottom surface side of the package. A BGA (Ball grid array) in which solder balls are used as bumps 440 on the bottom surface of the package is employed. Note that, other than the BGA, an LGA (Land grid array), a PGA (Pin Grid Array), or the like may be employed.

Figure 16E:
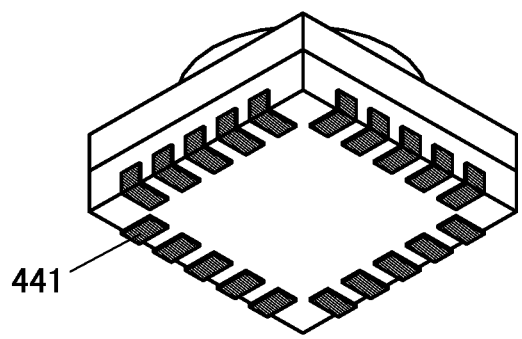
Figure 16C:
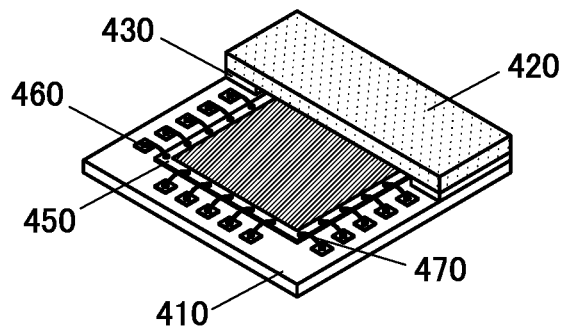

FIG. 16C is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 16D is an external perspective view of the top surface side of a camera module in which an image sensor chip is placed in a package with a built-in lens. The camera module includes a package substrate 411 to which an image sensor chip 451 (see FIG. 16F) is fixed, a lens cover 421, a lens 435, and the like. Furthermore, an IC chip 490 (see FIG. 16F) having functions of a driver circuit, a signal conversion circuit, and the like of an imaging device is provided between the package substrate 411 and the image sensor chip 451; thus, the structure as an SiP (System in package) is included.

FIG. 16E is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

Figure 16F:
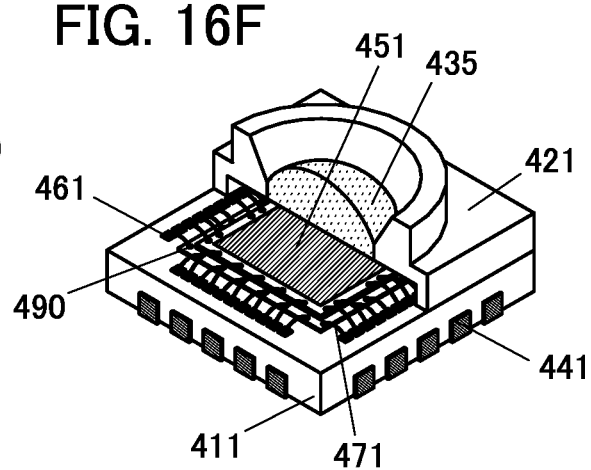

FIG. 16F is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above-described form can be easily mounted on a printed substrate or the like, and the image sensor chip can be incorporated in a variety of semiconductor devices and electronic devices.

This embodiment can be combined with the description of the other embodiments as appropriate.

Embodiment 3

As electronic devices that can use the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 17A to FIG. 17F illustrate specific examples of these electronic devices.

Figure 17A:
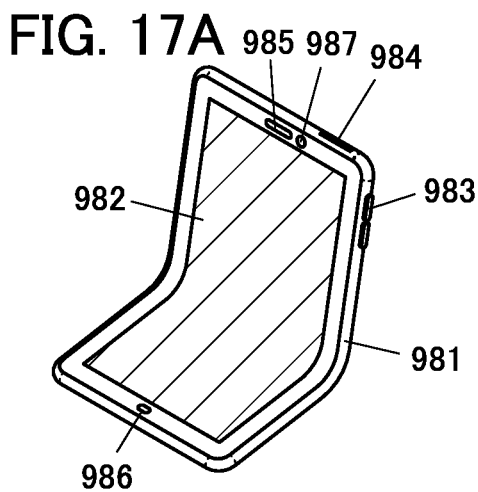

FIG. 17A is an example of a mobile phone, which includes a housing 981, a display portion 982, an operation button 983, an external connection port 984, a speaker 985, a microphone 986, a camera 987, and the like. The display portion 982 of the mobile phone is provided with a touch sensor. A variety of operations such as making a call and inputting text can be performed by touch on the display portion 982 with a finger, a stylus, or the like. The imaging device of one embodiment of the present invention and the operation method thereof can be used in the mobile phone, resulting in a reduction in power consumption.

Figure 17B:
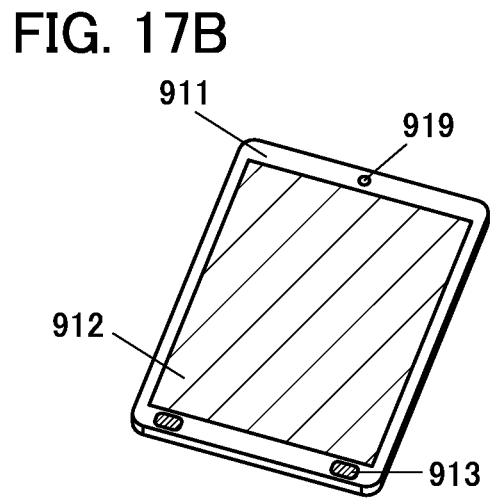

FIG. 17B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used in the portable data terminal, resulting in a reduction in power consumption.

Figure 17C:
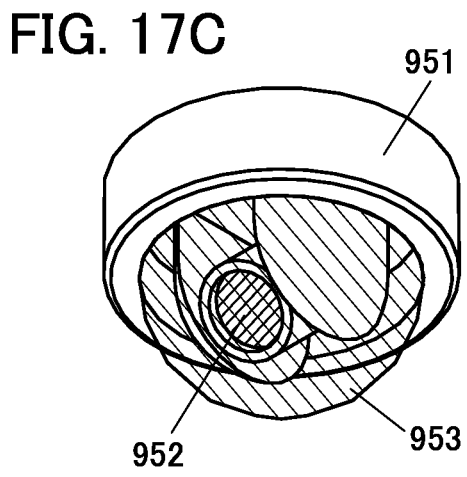

FIG. 17C is a surveillance camera, which includes a support base 951, a camera unit 952, a protection cover 953, and the like. By setting the camera unit 952 provided with a rotating mechanism and the like on a ceiling, an image of all of the surroundings can be taken.

The imaging device of one embodiment of the present invention and the operation method thereof can be used for obtaining an image in the camera unit, resulting in a reduction in power consumption. Note that a surveillance camera is a name in common use and does not limit the use thereof. A device that has a function of a surveillance camera can also be called a camera or a video camera, for example.

Figure 17D:
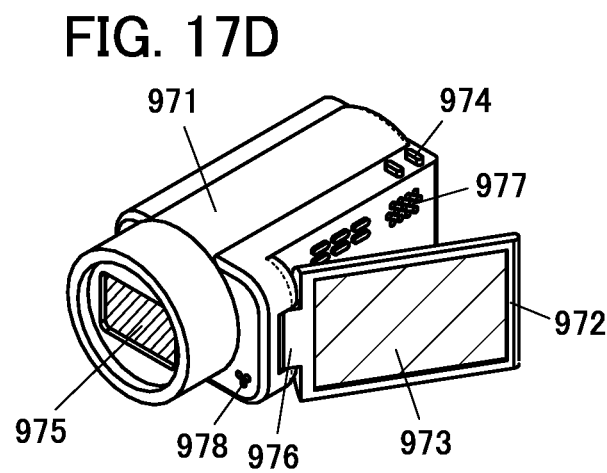

FIG. 17D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera, resulting in a reduction in power consumption.

Figure 17E:
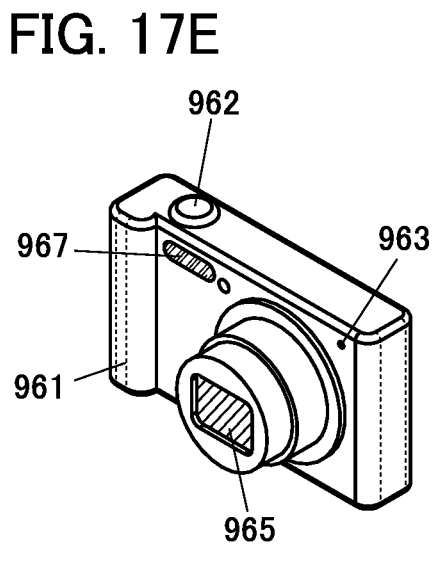

FIG. 17E is a digital camera, which includes a housing 961, a shutter button 962, a microphone 963, a light-emitting portion 967, a lens 965, and the like. The imaging device of one embodiment of the present invention and the operation method thereof can be used in the digital camera, resulting in a reduction in power consumption.

Figure 17F:
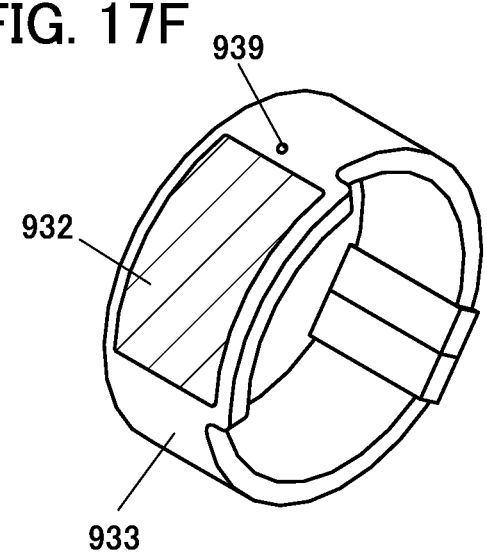

FIG. 17F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used in the information terminal, resulting in a reduction in power consumption.

This embodiment can be combined with the description of the other embodiments as appropriate.

Reference Numerals

C11: capacitor, C12: capacitor, DOUT: signal, EVAL: wiring, EVA: signal, NFD: node, RESL: wiring, RES: signal, PREL: wiring, PRE: signal, SELBL: wiring, SELB: signal, SW1: switch, SW2: switch, SW3: switch, TXL: wiring, TX: signal, VBL: wiring, WL: wiring, 11: transistor, 12: transistor, 13: transistor, 14: transistor, 15: transistor, 17: transistor, 18: transistor, 19: transistor, 21: transistor, 22: transistor, 23: transistor, 100: pixel, 100*a*: circuit, 100*b*: circuit, 101: wiring, 102: wiring, 103: wiring, 104: wiring, 105: wiring, 106: wiring, 107: wiring, 108: wiring, 110: circuit, 111: wiring, 112: wiring, 113: wiring, 120: dynamic logic inverter, 121: photoelectric conversion device, 122:

XNOR circuit, 200: imaging device, 201: wiring, 202: wiring, 204: wiring, 205: wiring, 207: wiring, 208: wiring, 210: pixel array, 211: pixel block, 221: circuit, 222: circuit, 223: circuit, 231: circuit, 232: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 535: back gate, 545: semiconductor layer, 546: insulating layer, 560: layer, 561: layer, 562: layer, 562$a$: layer, 562$b$: layer, 563: layer, 563$a$: layer, 563$b$: layer, 563$c$: layer, 565$a$: layer, 565$b$: layer, 566$a$: layer, 566$b$: layer, 566$c$: layer, 566$d$: layer, 567$a$: layer, 567$b$: layer, 567$c$: layer, 567$d$: layer, 567$e$: layer, 610: silicon substrate, 611: insulating layer, 612: insulating layer, 613: insulating layer, 614: insulating layer, 615: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 648: insulating layer, 651: insulating layer, 652: insulating layer, 653: insulating layer, 654: insulating layer, 655: conductive layer, 661: insulating layer, 662: insulating layer, 664: insulating layer, 665: insulating layer, 671: light-blocking layer, 672: optical conversion layer, 672B: color filter, 672G: color filter, 672IR: infrared filter, 672R: color filter, 672UV: ultraviolet filter, 673: microlens array, 683: conductive layer, 684: conductive layer, 685: conductive layer, 686: conductive layer, 688: conductive layer, 689: conductive layer, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939:

camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising a plurality of pixel blocks, wherein each of the plurality of pixel blocks comprises N first circuits, N second circuits, a third circuit, and a wiring electrically connected to the third circuit,
wherein N is an integer greater than or equal to 1,
wherein each of the N first circuits comprises a photoelectric conversion device,
wherein the photoelectric conversion device is configured to convert incident light into an electrical signal,
wherein the K-th first circuit is configured to output a first signal that is obtained by binarizing the electrical signal to the K-th second circuit via a first transistor provided in the K-th first circuit,
wherein K is an integer greater than or equal to 1 and less than or equal to N,
wherein each of the N second circuits is configured to generate a second signal by multiplying the first signal by a weight coefficient and output the second signal to the wiring,
wherein the N second signals are added by being output to the wiring,
wherein one of a source and a drain of the first transistor is electrically connected to a first terminal of a fourth circuit provided in the K-th second circuit, and
wherein the other of the source and the drain of the first transistor is electrically connected to a first switch provided in the K-th second circuit.

2. The imaging device according to claim 1,
wherein the K-th first circuit is stacked over the K-th second circuit, and
wherein a second terminal of the fourth circuit provided in the K-th second circuit is electrically connected to one electrode of a capacitor provided in the K-th second circuit via the first switch provided in the K-th second circuit.

3. The imaging device according to claim 1,
wherein the N first circuits are stacked over the N second circuits and the third circuit.

4. The imaging device according to claim 1,
wherein each of the first circuits comprises a second transistor, and
wherein the second transistor comprises a metal oxide in a channel formation region.

5. An imaging device comprising a plurality of pixel blocks,
wherein each of the plurality of pixel blocks comprises N first circuits, N second circuits, a third circuit, and a wiring electrically connected to the third circuit,
wherein N is an integer greater than or equal to 1,
wherein each of the N first circuits comprises a photoelectric conversion device, a first transistor, a second transistor, and a third transistor,
wherein the photoelectric conversion device is configured to convert incident light into an electrical signal,
wherein the K-th first circuit is configured to output a first signal to the K-th second circuit,
wherein K is an integer greater than or equal to 1 and less than or equal to N,
wherein the photoelectric conversion device is electrically connected to one of a source and a drain of the first transistor,
wherein the other of the source and the drain of the first transistor is electrically connected to a gate of the second transistor,
wherein one of a source and a drain of the second transistor is electrically connected to one of a source and a drain of the third transistor,
wherein the other of the source and the drain of the third transistor is electrically connected to the second circuit,
wherein each of the N second circuits is configured to generate a second signal by multiplying the first signal by a weight coefficient and output the second signal to the wiring, and
wherein the N second signals are added by being output to the wiring.

6. The imaging device according to claim 5,
wherein the K-th first circuit is stacked over the K-th second circuit.

7. The imaging device according to claim 5,
wherein the N first circuits are stacked over the N second circuits and the third circuit.

8. The imaging device according to claim 5,
wherein at least one of the first transistor, the second transistor, and the third transistor comprises a metal oxide in a channel formation region.

9. An imaging device comprising a plurality of pixel blocks,
wherein each of the plurality of pixel blocks comprises N first circuits, N second circuits, a third circuit, and a wiring electrically connected to the third circuit,
wherein N is an integer greater than or equal to 1,
wherein each of the N first circuits comprises a photoelectric conversion device, a first transistor, a second transistor, and a third transistor,
wherein the photoelectric conversion device is configured to convert incident light into an electrical signal,
wherein the K-th first circuit is electrically connected to the K-th second circuit,
wherein K is an integer greater than or equal to 1 and less than or equal to N,
wherein the photoelectric conversion device is electrically connected to one of a source and a drain of the first transistor,
wherein the other of the source and the drain of the first transistor is electrically connected to a gate of the second transistor,
wherein one of a source and a drain of the second transistor is electrically connected to one of a source and a drain of the third transistor,
wherein the other of the source and the drain of the third transistor is electrically connected to the second circuit,
wherein each of the N second circuits is electrically connected to the wiring, and
wherein each of the N second circuits comprises an XNOR circuit and a capacitor.

10. The imaging device according to claim 9,
wherein the K-th first circuit is stacked over the K-th second circuit.

11. The imaging device according to claim 9,
wherein the N first circuits are stacked over the N second circuits and the third circuit.

12. The imaging device according to claim 9,
wherein at least one of the first transistor, the second transistor, and the third transistor comprises a metal oxide in a channel formation region.

* * * * *